(12) United States Patent
Hayashi et al.

(10) Patent No.: US 10,256,127 B2
(45) Date of Patent: Apr. 9, 2019

(54) SUBSTRATE TRANSFER APPARATUS, SUBSTRATE TRANSFER METHOD, AND NON-TRANSITORY STORAGE MEDIUM

(71) Applicant: Tokyo Electron Limited, Tokyo (JP)

(72) Inventors: Tokutarou Hayashi, Koshi (JP); Yuichi Douki, Koshi (JP); Hiromitsu Maejima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 261 days.

(21) Appl. No.: 15/278,155

(22) Filed: Sep. 28, 2016

(65) Prior Publication Data

US 2017/0018444 A1    Jan. 19, 2017

Related U.S. Application Data

(63) Continuation of application No. 13/752,440, filed on Jan. 29, 2013, now Pat. No. 9,507,349.

(30) Foreign Application Priority Data

Feb. 3, 2012 (JP) ................................. 2012-022047

(51) Int. Cl.
  *G05D 3/12* (2006.01)
  *H01L 21/67* (2006.01)
  *H01L 21/677* (2006.01)
  *H01L 21/68* (2006.01)
  *G05B 19/418* (2006.01)

(52) U.S. Cl.
  CPC .... *H01L 21/67259* (2013.01); *G05B 19/4189* (2013.01); *G05D 3/125* (2013.01); *H01L 21/67742* (2013.01); *H01L 21/681* (2013.01); *G05B 2219/45032* (2013.01); *G05B 2219/45051* (2013.01)

(58) Field of Classification Search
  CPC ....................................................... G05D 3/12
  See application file for complete search history.

(56) References Cited

U.S. PATENT DOCUMENTS

| 6,298,280 | B1 | 10/2001 | Bonora et al. |
| 6,405,101 | B1 | 6/2002 | Johanson et al. |
| 7,311,738 | B2 | 12/2007 | Kitayama |
| 2012/0046904 | A1 | 2/2012 | Hayashi et al. |

FOREIGN PATENT DOCUMENTS

| JP | 08-031905 A | 2/1992 |
| JP | 2006-351884 A | 12/2006 |

*Primary Examiner* — Tejal Gami
(74) *Attorney, Agent, or Firm* — Posz Law Group, PLC

(57) ABSTRACT

A substrate transfer apparatus to transfer a circular substrate provided with a cutout at an edge portion thereof, includes: a sensor part including three light source parts applying light to positions different from one another at the edge portion, and three light receiving parts paired with the light source parts; and a drive part for moving the substrate holding part, wherein the three light source parts apply light to the light receiving parts so that whether or not a detection range of the sensor part overlaps with the cutout of the substrate is determined on the basis of an amount of received light by each light receiving part, and when it is determined that there is an overlap at any position, positions of the edge portion of the substrate are further detected with the position of the substrate displaced with respect to the sensor part.

13 Claims, 26 Drawing Sheets

FIG.8

| | RETRACTED POSITION | FIRST SLIGHTLY ADVANCED POSITION | SECOND SLIGHTLY ADVANCED POSITION | DIFFERENCE IN CENTER COORDINATES (Y COMPONENT) BETWEEN RETRACTED POSITION AND FIRST SLIGHTLY ADVANCED POSITION |
|---|---|---|---|---|
| COORDINATES (X, Y) DETECTED BY DETECTION PART 4A | | | | |
| COORDINATES (X, Y) DETECTED BY DETECTION PART 4B | | | | |
| COORDINATES (X, Y) DETECTED BY DETECTION PART 4C | | | | |
| COORDINATES (X, Y) DETECTED BY DETECTION PART 4D | | | | |
| CENTER COORDINATES o'1 (X, Y) CALCULATED BY 4A, 4B, 4D | | | | |
| CENTER COORDINATES o'2 (X, Y) CALCULATED BY 4A, 4B, 4C | | | | |
| CENTER COORDINATES o'3 (X, Y) CALCULATED BY 4B, 4C, 4D | | | | |
| CENTER COORDINATES o'4 (X, Y) CALCULATED BY 4A, 4C, 4D | | | | |
| RADIUS R'1 (X, Y) CALCULATED BY 4A, 4B, 4D | | | | |
| RADIUS R'2 (X, Y) CALCULATED BY 4A, 4B, 4C | | | | |
| RADIUS R'3 (X, Y) CALCULATED BY 4B, 4C, 4D | | | | |
| RADIUS R'4 (X, Y) CALCULATED BY 4A, 4C, 4D | | | | |

55

FORK AT RETRACTED POSITION

FORK RETRACTED POSITION

R'1=R'3 : NORMAL RANGE
R'2, R'4 < NORMAL RANGE

FORK AT FIRST SLIGHTLY ADVANCED POSITION

FORK AT RETRACTED POSITION

FORK AT FIRST SLIGHTLY ADVANCED POSITION

FORK AT SECOND SLIGHTLY ADVANCED POSITION

RETRACTED POSITION

SUBSTRATE TRANSFER APPARATUS, SUBSTRATE TRANSFER METHOD, AND NON-TRANSITORY STORAGE MEDIUM

CROSS REFERENCE TO RELATED APPLICATIONS

The present application is a continuation of U.S. patent application Ser. No. 13/752,440 filed on Jan. 29, 2013 and is related to, claims priority from and incorporates by reference Japanese Patent Application No. 2012-022047 filed on Feb. 3, 2012.

BACKGROUND OF THE INVENTION

1. Field of the Invention

The present invention relates to a substrate transfer apparatus for transferring a substrate between modules, a substrate transfer method, and a non-transitory storage medium storing a program for executing the substrate transfer method.

2. Description of the Related Art

In a manufacturing process of, for example, a semiconductor device, a plurality of treatment modules each performing treatment on a wafer being a substrate are provided in an apparatus and the wafer is sequentially transferred by a substrate transfer apparatus between the treatment modules, whereby predetermined treatments are performed. The substrate transfer apparatus includes a holding part holding the wafer.

For performing appropriate treatments on the wafer, it is required to accurately deliver the wafer to a predetermined position in the module. To this end, it is studied to detect the position of the edge portion of the wafer on the holding part by a detection part (sensor) and transfer the wafer on the basis of the detected position. For example, in Japanese Laid-open Patent Publication No. H08-031905, it is described to correct the transfer amount of the wafer between the modules on the basis of the detected position of the edge portion of the wafer so as to eliminate the positional displacement of the wafer in the module. It is also described in Japanese Laid-open. Patent Publication No. 2006-351884 to obtain a center position of the wafer from the detected positions of the edge portion and to conduct control for a transfer arm part to be able to move and mount the wafer to a transfer target position on the basis of the displacement amount between the center position and a predetermined reference position.

However, the wafer is not a round but has a cutout (notch) for positioning of the wafer formed at its edge portion. When a detection range of the detection part overlaps with the cutout, the position of the wafer at the holding part cannot be correctly detected any longer, and therefore, something needs to be done. Further, in the case of failure of the plurality of detection parts due to some problem, it is conceivable that the transfer of the wafer under treatment in the apparatus is stopped and an operator enters the apparatus to collect the wafer and removes the wafer. In this case, however, the treatment on the wafer is suspended in the apparatus and the throughput may greatly decrease. In such circumstances, it is desired to accurately detect the position of the wafer even when a part of the plurality of detection parts are unusable. The apparatuses in Japanese Laid-open Patent Publication No. H08-031905 and No. 2006-351884 in which these problems are not into consideration cannot solve the problems.

SUMMARY OF THE INVENTION

The present invention has been made in consideration of the above points and its object is to provide a technique capable of, when transferring a circular substrate having a cutout provided at an edge portion, accurately transferring the substrate to a module even with a small number of light source parts and light receiving parts pared with the light source parts which detect positions of an edge portion of the substrate respectively.

A substrate transfer apparatus of the present invention is a substrate transfer apparatus including a substrate holding part movable in a lateral direction to transfer a circular substrate provided with a cutout at an edge portion thereof from a first module to a second module, including:

a sensor part including three light source parts applying light to positions different from one another at the edge portion, and three light receiving parts paired with the light source parts, to detect positions of three points of the edge portion of the substrate held by the substrate holding part;

a drive part for moving the substrate holding part relative to the sensor part; and a control part outputting control signals to control operations of the substrate holding part, the drive part, and the sensor part, wherein the control part outputs the control signals to execute:

a first step of detecting positions of the edge portion of the substrate with the substrate holding part holding the substrate received from the first module located at a first position preset with respect to the sensor part;

a second step of detecting positions of the edge portion of the substrate with the substrate holding part located at a second position displaced from the first position with respect to the sensor part;

a third step of deriving, assuming that a state that a light irradiation region of the light source part is located at the cutout of the substrate is called an abnormal state, and based on detection results at the first step and the second step, any of results:

a. that the abnormal state occurs at any of the first position and the second position and that position is able to be specified;
  b. that the abnormal state does not occur at any of the first position and the second position;
  c. that the abnormal state occurs at both of the first position and the second position; and
  d. that the abnormal state occurs at least at any of the first position and the second position but that position is not able to be specified; and a fourth step of deciding, when a result at the third step is a or b, a delivery position of the substrate holding part with respect to the second module on the basis of the positions of the edge portion detected at the first position or the second position, and detecting, when the result is c or d, positions of the edge portion of the substrate with the substrate holding part moved to a third position different from the first position and the second position with respect to the sensor part to apply light to a position off the cutout of the substrate, and deciding the delivery position on the basis of the positions.

The present invention according to another aspect is a substrate transfer method using a substrate transfer apparatus including a substrate holding part movable in a lateral direction to transfer a circular substrate provided with a cutout at an edge portion thereof from a first module to a second module, the substrate transfer apparatus including:

a sensor part including three light source parts applying light to positions different from one another at the edge portion, and three light receiving parts paired with the light source parts, to detect positions of three points of the edge portion of the substrate held by the substrate holding part; and a drive part for moving the substrate holding part relative to the sensor part, and the substrate transfer method including:

a first step of detecting positions of the edge portion of the substrate with the substrate holding part holding the substrate received from the first module located at a first position preset with respect to the sensor part;

a second step of detecting positions of the edge portion of the substrate with the substrate holding part located at a second position displaced from the first position with respect to the sensor part;

a third step of deriving, assuming that a state that a light irradiation region of the light source part is located at the cutout of the substrate is called an abnormal state, and based on detection results at the first step and the second step, any of results:
  a. that the abnormal state occurs at any of the first position and the second position and that position is specified;
  b. that the abnormal state does not occur at any of the first position and the second position;
  c. that the abnormal state occurs at both of the first position and the second position; and
  d. that the abnormal state occurs at least at any of the first position and the second position but that position is not able to be specified; and a fourth step of deciding, when a result at the third step is a or b, a delivery position of the substrate holding part with respect to the second module on the basis of the positions of the edge portion detected at the first position or the second position, and detecting, when the result is c or d, positions of the edge portion of the substrate with the substrate holding part moved to a third position different from the first position and the second position with respect to the sensor part to apply light to a position off the cutout of the substrate, and deciding the delivery position on the basis of the positions.

The present invention according to still another aspect is a non-transitory storage medium storing a computer program used in a substrate transfer apparatus including a substrate holding part movable in a lateral direction to transfer a circular substrate provided with a cutout at an edge portion thereof from a first module to a second module, wherein the computer program is to execute a substrate transfer method using the substrate transfer apparatus, the substrate transfer apparatus including:

a sensor part including three light source parts applying light to positions different from one another at the edge portion, and three light receiving parts paired with the light source parts, to detect positions of three points of the edge portion of the substrate held by the substrate holding part; and a drive part for moving the substrate holding part relative to the sensor part, and the substrate transfer method including:

a first step of detecting positions of the edge portion of the substrate with the substrate holding part holding the substrate received from the first module located at a first position preset with respect to the sensor part;

a second step of detecting positions of the edge portion of the substrate with the substrate holding part located at a second position displaced from the first position with respect to the sensor part;

a third step of deriving, assuming that a state that a light irradiation region of the light source part is located at the cutout of the substrate is called an abnormal state, and based on detection results at the first step and the second step, any of results:
  a. that the abnormal state occurs at any of the first position and the second position and that position is specified;
  b. that the abnormal state does not occur at any of the first position and the second position;
  c. that the abnormal state occurs at both of the first position and the second position; and
  d. that the abnormal state occurs at least at any of the first position and the second position but that position is not able to be specified; and a fourth step of deciding, when a result at the third step is a or h, a delivery position of the substrate holding part with respect to the second module on the basis of the positions of the edge portion detected at the first position or the second position, and detecting, when the result is c or d, positions of the edge portion of the substrate with the substrate holding part moved to a third position different from the first position and the second position with respect to the sensor part to apply light to a position off the cutout of the substrate, and deciding the delivery position on the basis of the positions.

According to the present invention, the light source part constituting the detection part applies light to the light receiving part at each position with the position of the substrate displaced with respect to the sensor part, and whether or not the detection range of the sensor part overlaps with the cutout of the substrate is determined on the basis of each amount of received light. When it is determined that there is an overlap at any position, the position of the substrate is further displaced with respect to the sensor part and positions of the edge portion of the substrate are detected. Consequently, it is possible to accurately deliver the substrate to a module while suppressing the number of required light source parts and light receiving parts.

BRIEF DESCRIPTION OF THE DRAWINGS

FIG. 8 is a conceptual diagram of a memory provided in the control part;

DETAILED DESCRIPTION OF THE INVENTION

Figure 1:
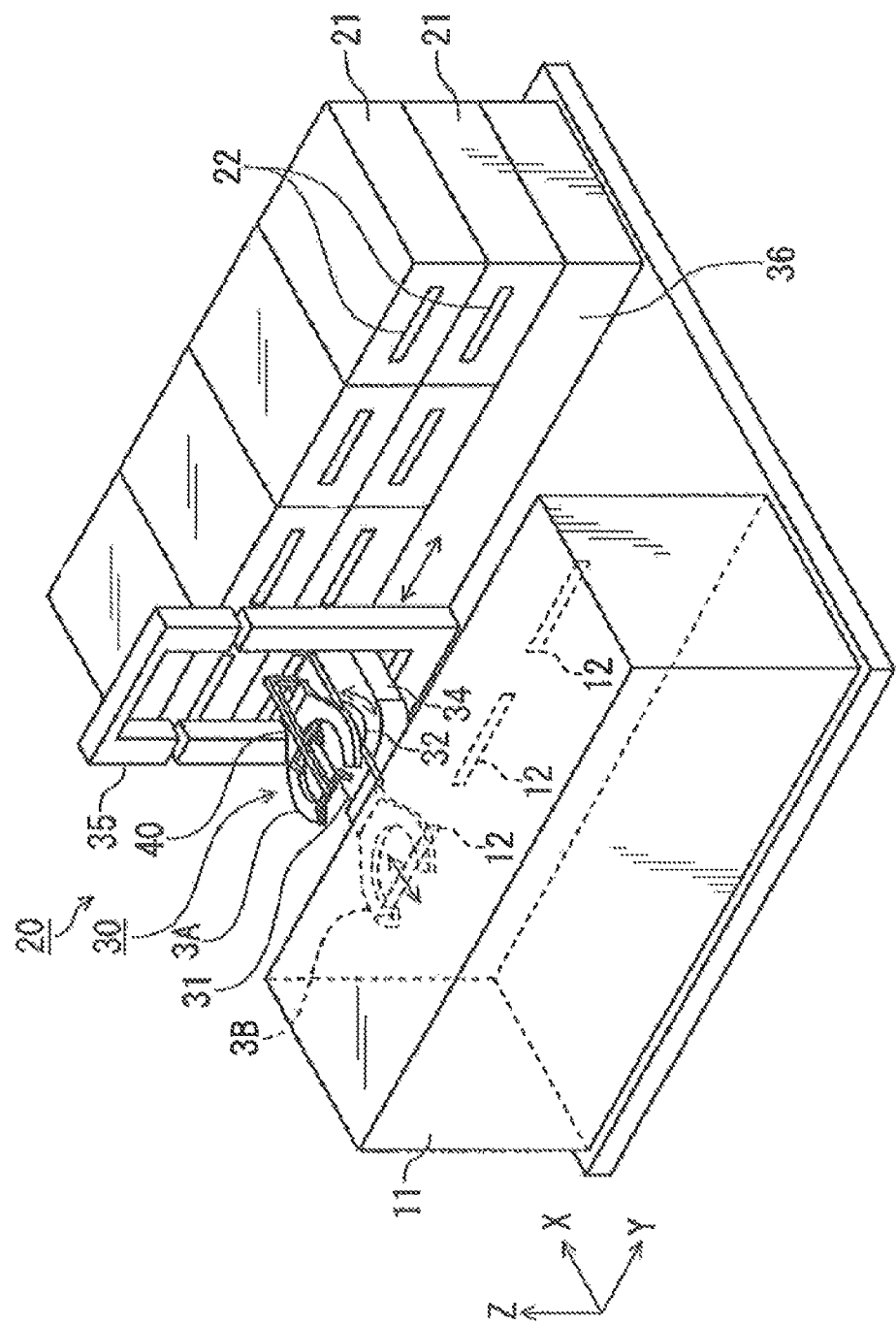
FIG. 1 is a perspective view of a transfer arm constituting a substrate transfer mechanism according to the present invention and modules.

FIG. 1 illustrates a perspective view of a transfer arm 30 that forms a substrate transfer apparatus and a group of modules to which a wafer W that is a circular substrate is delivered by the transfer arm 30. An edge portion of the wafer W is provided with a notch N that is a cutout. A numeral 11 in the drawing denotes a housing that houses a module COT applying a resist to the wafer W. A wafer W is delivered to the module COT through a transfer port 12 and subjected to a resist coating treatment. The housing 11 faces a transfer path 20 for the wafer W in which the transfer arm 30 moves, and a plurality of heating modules 21 are provided to face the housing 11 across the transfer path 20. The heating module 21 includes a heating plate on which the wafer W coated with the resist is mounted, and performs a heat treatment on the wafer W. A numeral 22 in the drawing denotes a transfer port for the wafer W in the heating module 21.

The transfer arm 30 transfers the wafer W from a module on the upstream side (omitted in FIG. 1) to the resist coating module and then transfers the wafer W to the heating module 21, and the wafer W is subjected to a series of treatments. The transfer arm 30 includes forks 3 (3A, 3B) each forming a holding part for the wafer W, a base 31, a rotation mechanism 32, a lift table 34 and a substrate edge position detection mechanism 40.

The two forks 3A, 3B are supported on the base 31 via supporting parts 33A, 33B respectively to overlap one above the other, and advance and retract independently of each other on the base 31. The base 31 is provided on the lift table 34 to be rotatable around the vertical axis by means of the rotation mechanism 32. The lift table 34 is provided to be surrounded by a frame 35 extended in the vertical direction and lifts up and down in the vertical direction (a Z-direction in FIG. 1). A mechanism for lifting up and down the lift table 34 is provided inside the frame 35. A Y-axis guide rail linearly extending in a lateral direction (a Y-direction in FIG. 1) is provided on a housing 36 provided under the heating modules 21. The frame 35 is connected to the guide rail. The frame 35 is therefore configured to move in the Y-direction. This configuration allows the forks 3A, 3B to be movable in the Z-direction, the Y-direction and an X-direction perpendicular to the Z and Y-directions and rotatable around the vertical axis and to access each of the aforementioned modules and deliver the wafer W to the module.

Figure 2:
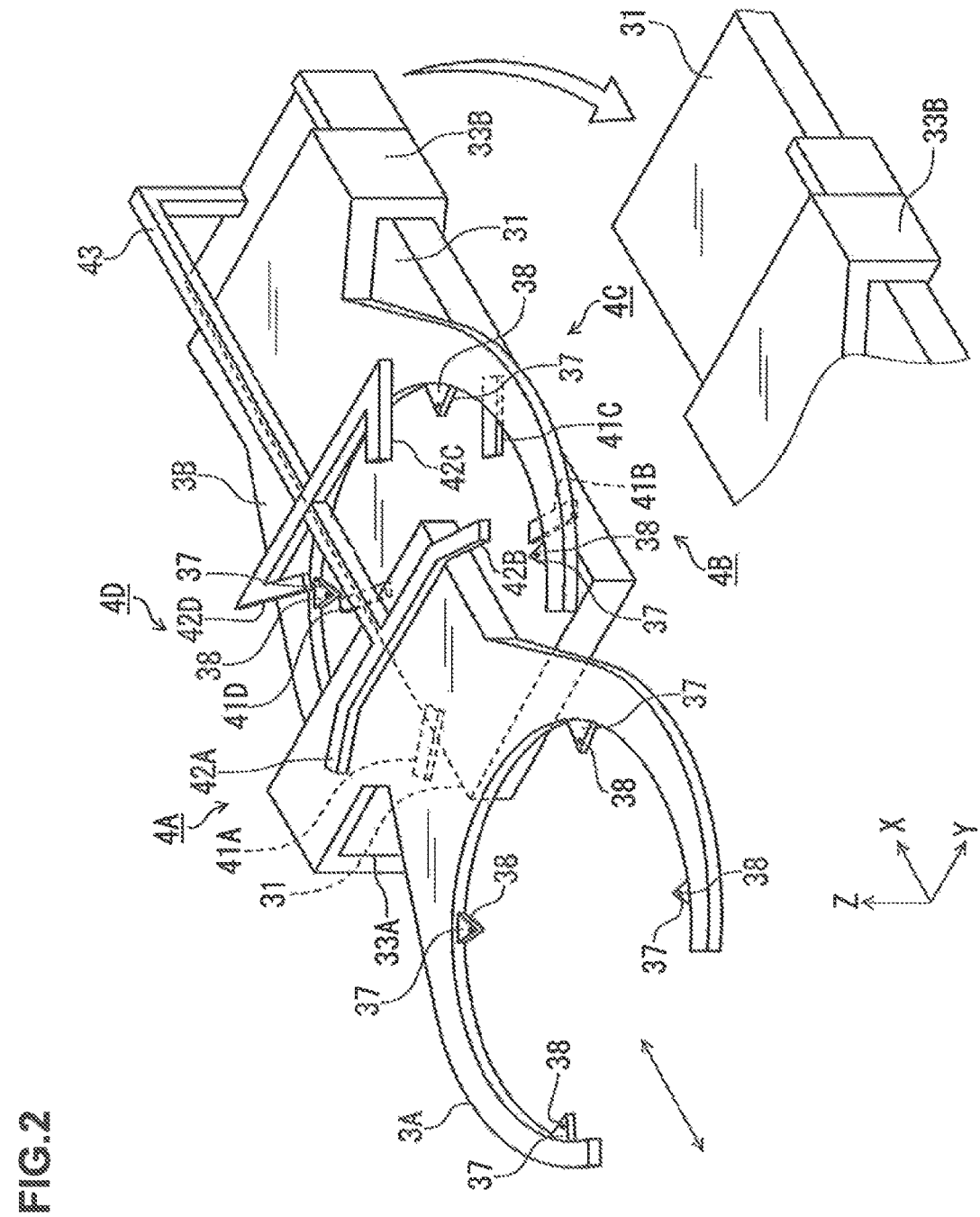
FIG. 2 is a perspective view of the transfer arm.
Figure 3:
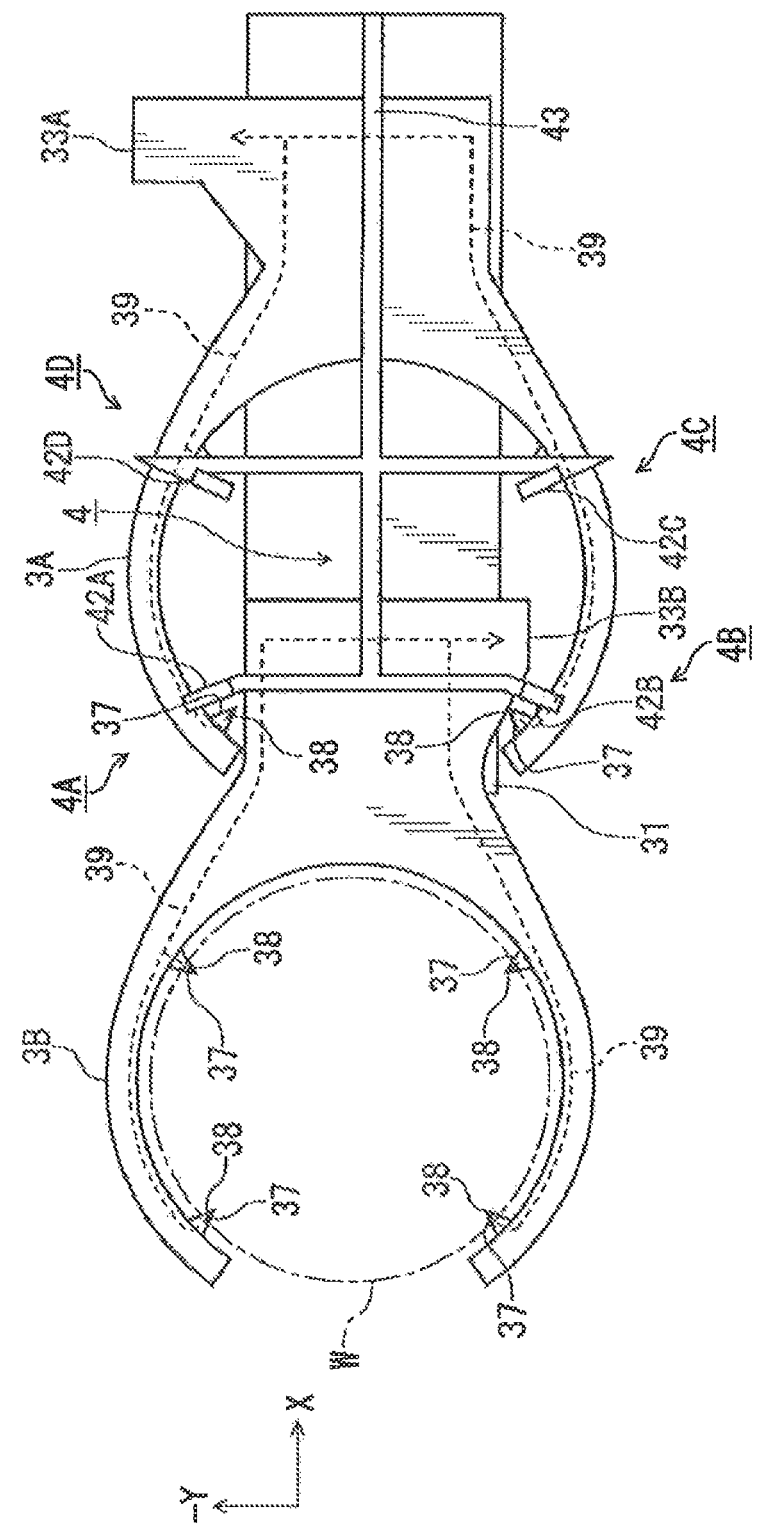
FIG. 3 is a plan view of the transfer arm.
Figure 4:
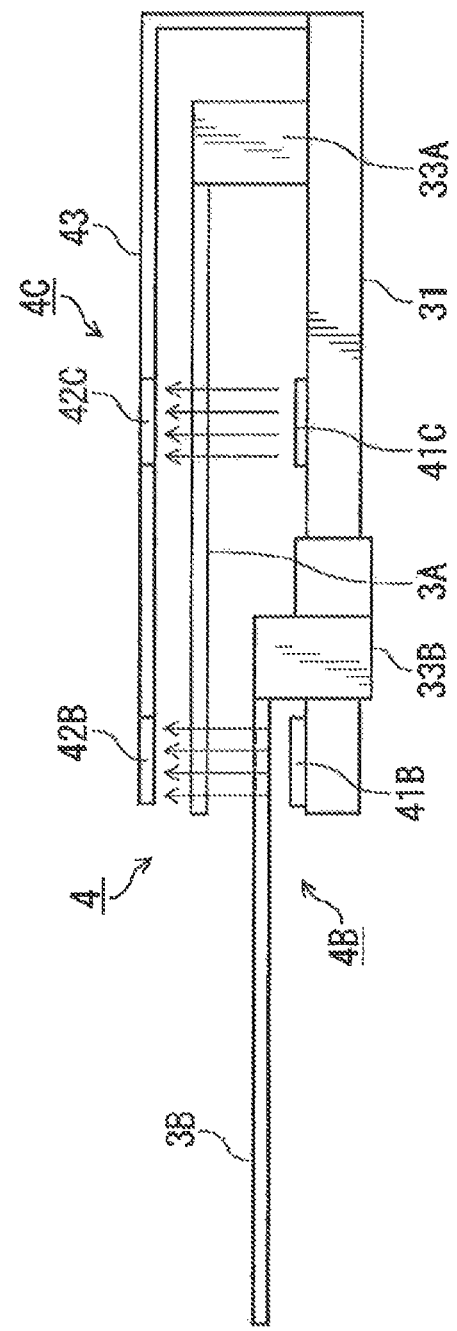
FIG. 4 is a side view of the transfer arm.

The base (moving body) 31 and the forks 3A, 3B of the transfer arm 30 will be further explained referring also to FIG. 2, FIG. 3, FIG. 4 that are a perspective view, a plan view, and a side view thereof. The forks 3A, 3B are configured to be identical with each other, and therefore the fork 3A will be explained as a representative. The fork 3A is formed in a flat arc shape and configured to surround the periphery of the wafer W to be transferred as illustrated in FIG. 3. The inner periphery of the fork 3A is formed to be slightly larger than the outer periphery of the wafer W so that the wafer W can be transferred even if the position of the wafer W is slightly displaced during transfer inside and outside the module.

Further, on the lower side of the inner periphery of the fork 3A, four holding claws 37 on which a rear surface edge portion of the wafer W will be mounted are formed at intervals to project toward the inside of the fork 3A. Each of the holding claws 37 is provided with a vacuum suction port 38. When the rear surface edge portion of the wafer W is mounted on the holding claws 37, the vacuum suction ports 38 vacuum-suck the edge portion to hold the wafer W on the holding claws 37. The vacuum suction ports 38 are connected to a pipe 39 provided in the fork 3A. The vacuum suction performed as described above enables positioning of the horizontal position of the edge portion of the wafer W.

The fork 3 advances and retracts on the base 31 as described above, but is usually located at a retracted position on the base 31. For delivering the wafer W to a module, the fork 3 moves to a delivery position advanced from the retracted position. FIG. 3 and FIG. 4 indicate a state that the forks 3A, 3B has moved to the retracted position and the delivery position respectively. The transfer arm 30 receives a wafer W from a module by one fork and delivers a wafer W to the module by the other fork. In short, the transfer arm 30 acts to replace the held wafers W with respect to the module.

Subsequently, the substrate edge position detection mechanism 40 will be explained. The substrate edge position detection mechanism 40 that is a sensor part includes four detection parts 4 (4A to 4D), which are provided to detect positions of the edge portion of the wafer W respectively when the fork 3A or 3B is located at the retracted position (reference position) on the base 31 while holding the wafer W. The detection parts 4A to 4D are provided at intervals along the edge portion of the wafer W to be able to detect four edge positions of the wafer W different from each other.

The detection parts 4 are composed of four light source parts 41 (41A to 41D) and four light receiving parts 42 (42A to 42D) paired with the respective light source parts 41. The light source parts 41 (41A to 41D) include, for example, LED (Light Emitting Diodes) and are provided on the base 31 and arranged, for example, below the fork 3A, 3B at the retracted position. Further, the light source parts 41 include not-illustrated lenses and radiate light of the LED vertically upward via the lenses as illustrated by arrows in FIG. 4. Further, the irradiation region of the light of the light source part 41 is formed, in a plan view, linearly from the outside to the center part side of the wafer W on the fork 3 at the retracted position.

The light receiving part 42 is a linear image sensor (LIS) composed of a plurality of linearly arranged light receiving elements. The light receiving element is composed of, for example, a CCD (Charge Coupled Device). The light receiving parts 42 are provided on the base 31 via a supporting member 43 and arranged above the forks 3A, 3B. More specifically, the light source parts 41 and the light receiving parts 42 paired with each other are provide above and below the wafer W held by the fork 3A, 3B at the retracted position intervening therebetween. The light receiving elements of the light receiving part 42 are arranged from the outside to the center portion side of the wafer W to be able to receive the light from the light source part 41.

At the time when the fork 3 holds the wafer W and stops at the retracted position and at a position slightly advanced from the retracted position as will be described later, the light source parts 41A to 41D emit light upward from below. The emitted light is received by the light receiving parts 42A to 42D provided above the fork 3A. In this event, a later-described control part can decide the position of the boundary between a pixel which has received the light and a pixel which has not received the light on the basis of detection values of the CCDs that are pixels of the light receiving parts 42A to 42D. The decided position of the boundary can be expressed by coordinates with a predetermined position on an XY-plane as an original point, and calculation for calculating the center position and the radius of the wafer W can be performed as will be described later. A Y direction within the XY-plane is the moving direction of the base 31, and an X-direction is a direction which is perpendicular to the Y-direction and in which the fork 3 moves.

Figure 5:
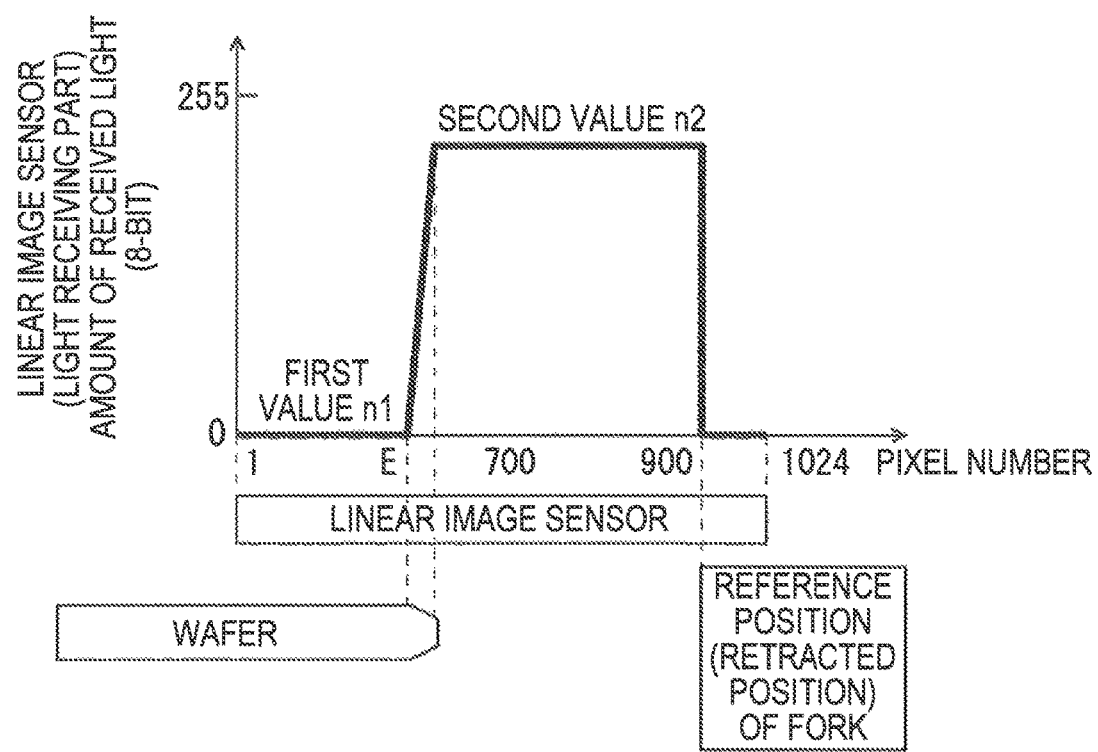
FIG. 5 is a schematic diagram illustrating an example of a detection result by a detection part of the transfer arm.

The concrete appearance that the light receiving part 42 recognizes the position of the boundary, namely, the position of the edge portion of the wafer W will be explained using FIG. 5. FIG. 5 is a graph schematically illustrating the relationship between the positions of the wafer W and the fork 3 and the amount of received light by the pixel corresponding to each light receiving element in the light receiving part (linear image sensor) 42, in which the detection value of the pixel which has not received the light emitted from the light source part 41 (hereinafter, referred to as an "amount of received light") is a first value n1 and the amount of received light by the pixel which has received the light emitted from the light source part 41 is a second value n2. In this event, the position of the edge portion of the wafer W can be detected as a position B where the amount of received light by each pixel varies between the first value n1 and the second value n2. When the amount of received light is processed as 8-bit data, the first value n1 can be, for example, 0 and the second value n2 can be, for example, a predetermined value equal to or less than 255. In FIG. 5, numbers (pixel numbers) are given to the pixels from the inside of the wafer W, and the pixel number of the light receiving element from which the light emitted from the light source part 41 is shielded by the fork 3 when the fork 3 retracted on the base 31 is located at the reference position (retracted position) is 900. As described above, the light receiving part 42 is configured as a CCD line sensor that detects the position of the edge portion of the wafer W along the direction in which the light receiving part 42 extends.

Figure 6:
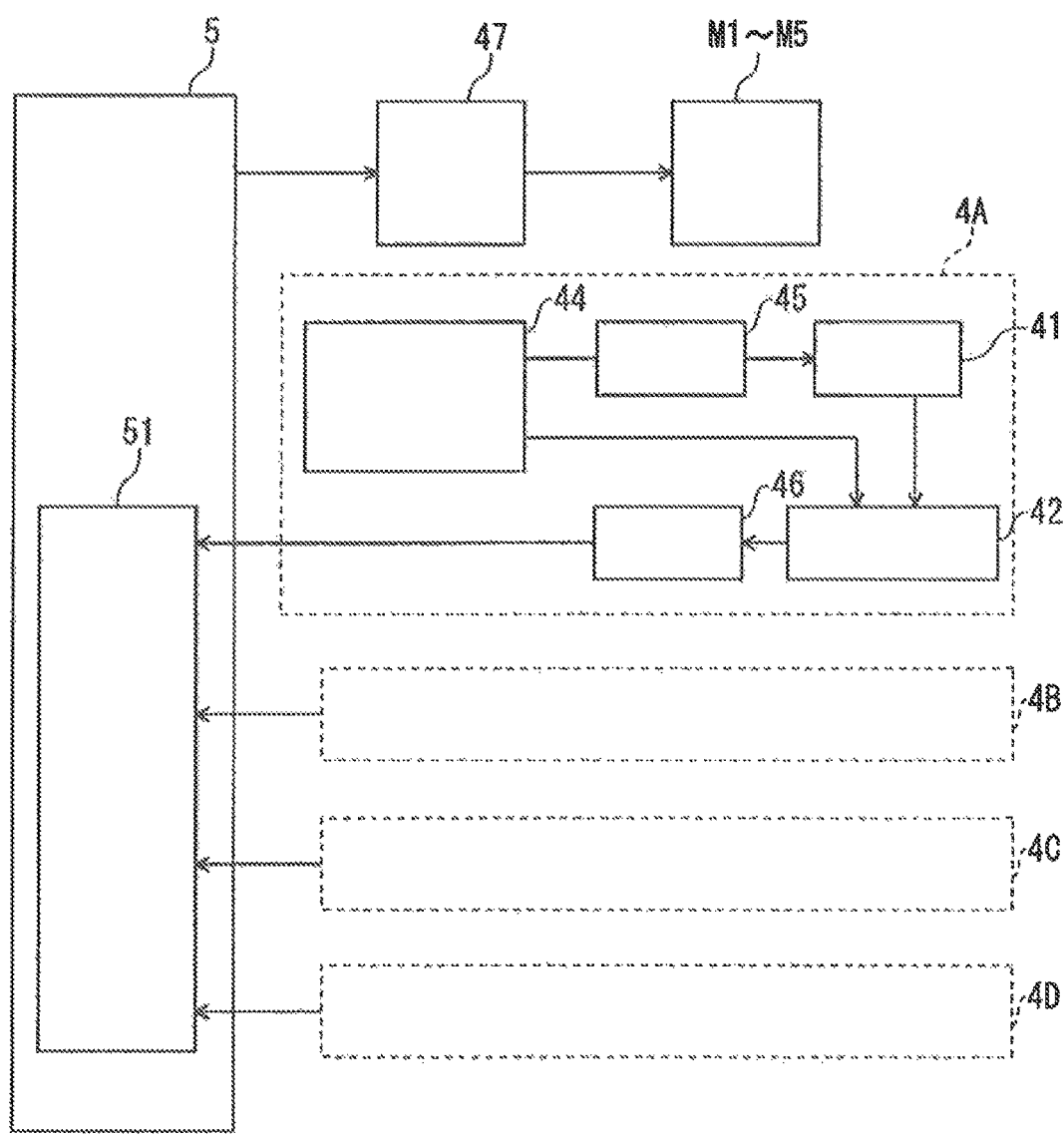
FIG. 6 is a block diagram of the detection part of an edge position detection mechanism.

The configuration of the detection part 4 will be further explained. As illustrated in FIG. 6, the detection part 4 has a CCD line sensor control part 44, a digital-analogue converter (DAC) 45, and an analogue-digital converter (ADC) 46 in addition to the light source part 41 and the light receiving part 42. The CCD line sensor control part 44 is a timing generator that shifts an operation timing of each light receiving element (CCD element) of the CCD line sensor forming the light receiving part 42 on the basis of a clock signal from a not-illustrated clock to move charges, and also performs current control to the light source part 41. In order to input a digital control signal from the CCD line sensor control part 44 into the light source part 41, the DAC 45 performs analog conversion. In order to output an analog output signal being a detection signal from the light receiving part 42 to the later-described control part 5, the ADC 46 performs digital conversion.

By the above configuration, the control signal from the CCD line sensor control part 44 is analog-converted by the DAC 45 and inputted into the light source part 41. This causes the LED of the light source part 41 to emit light. The light receiving part 42 that has received the output light from the light source part 41 outputs a signal corresponding to the amount of received light of each pixel by movement of charges in the light receiving part 42 on the basis of timing of the control signal from the CCD line sensor control part 44. This signal (detection value) is inputted into the control part 5 via the ADC 46.

The transfer arm 30 includes the control part 5 composed of a computer, and operations of its parts are controlled by the control part 5. The control will be explained referring also to the block diagram of the control part 5 illustrated in FIG. 7. The control part 5 controls, via an amplifier 47, five motors M1 to M5 in total that are motors M1, M2 for driving in the X-axis provided on the base 31 for driving the forks 3A, 3B, a motor M3 for driving in the Y-axis provided on the housing 36 for driving the base 31 in the Y-direction, a motor M4 for driving in the Z-axis provided on the frame 35 for driving the lift table 34 in the Z-direction, and a motor M5 for rotation driving provided on the rotation mechanism 32. The rotation operations of the motors M1 to M5 are transmitted to the fork 3, the base 31, the rotation mechanism 32, and the lift table 34 by a transmission mechanism such as a timing belt.

The parts of the transfer arm 30 linearly move in the X-, Y- and Z-directions respectively by the distances corresponds to the rotation mounts of the motors M1 to M5 to rotate the rotation mechanism 32. To each of the motors M1 to M5, an encoder 48 that outputs pulses according to the rotation amount of the motor and a counter 49 that counts the number of pulses are further connected. The counter 49 outputs a signal according to the count to the control parts 5, and the control parts 5 can thereby detect the position of each of the parts of the transfer arm 30. For preventing complication of the drawing, only one set of the motor M, the encoder 48 and the counter 49 is illustrated in FIG. 7.

Figure 7:
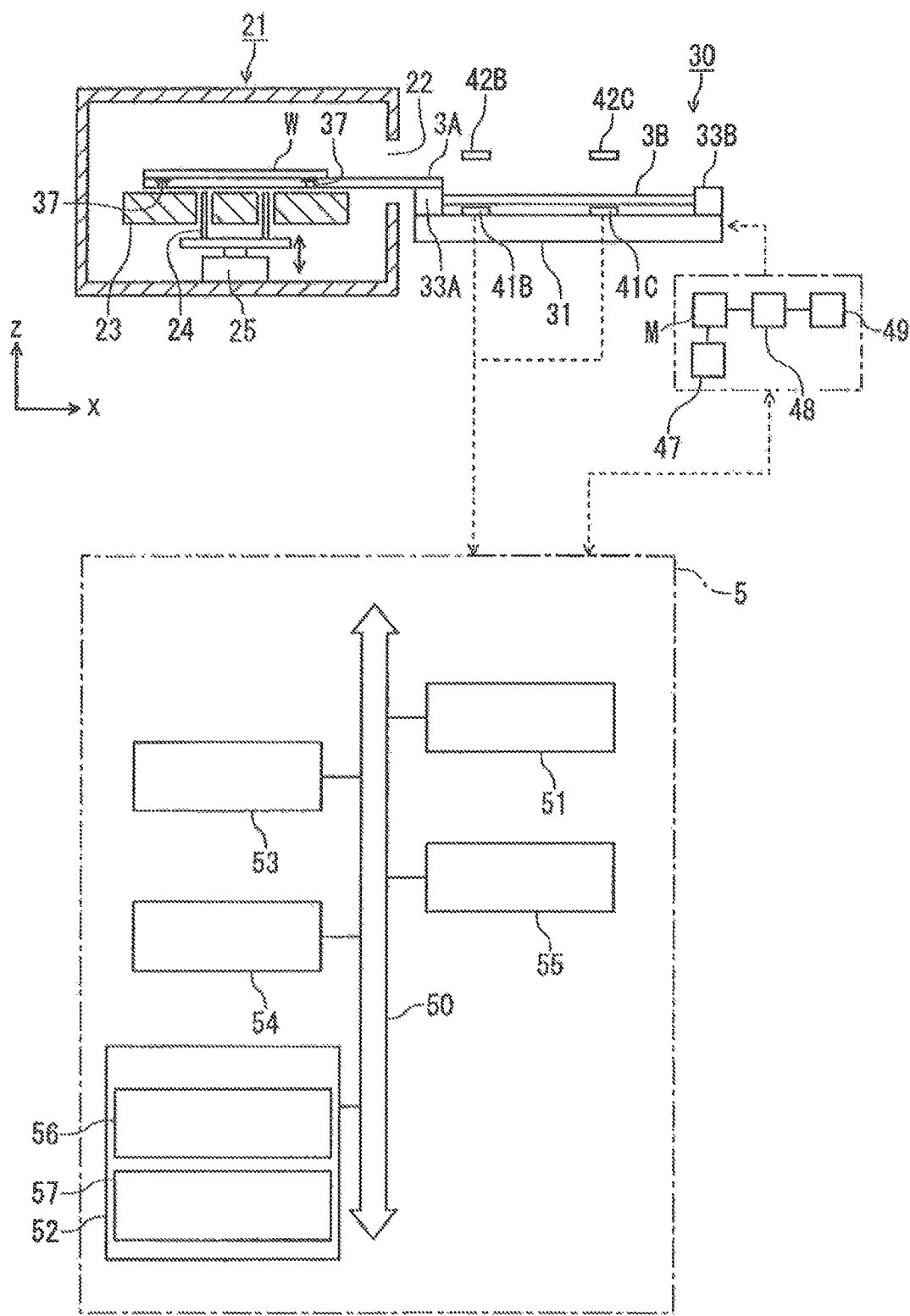
FIG. 7 is a block diagram of a control part controlling the operation of the transfer arm.

As illustrated in FIG. 7, the control part 5 includes a calculation processing part 51, a program storage part 52, a display part 53, an alarm generation part 54, and a storage part 55. A numeral 50 in the drawing denotes a bus. The calculation processing part 51 is a data processing part having, for example, a memory and a CPU (Central Processing Unit). The calculation processing part 51 reads programs recorded in the program storage part 52, transmits control signals to the respective parts according to instructions (commands) included in the programs to execute transfer of the wafer W.

The program storage part 52 is a computer-readable non-transitory storage medium and stores a normal mode execution program 56 and a temporary mode execution program 57 that are transfer modes for the wafer W. The modes will be described later. The program storage part 52 is composed of, for example, a flexible disk, a compact disk, a hard disk, a magnetoptical disk (MO) or the like. The display part 53 is composed of, for example, a computer screen.

Further, the control part 5 also controls the operations of the respective modules and can select various substrate treatments in the modules and perform input operation of parameters in the substrate treatments through the display part 53. For example, when one of the detection parts 4 becomes unusable, the alarm generation part 54 generates an alarm sound reporting the fact. The storage part 55 stores the positions of the edge portion (edge positions) of the wafer W detected by the detection parts 4A to 4D and the calculation values obtained by executing the aforementioned modes as illustrated in FIG. 8. The calculation values will be described when the modes are explained.

Incidentally, FIG. 7 illustrates a longitudinal sectional view of the heating module 21. Briefly explaining the configuration of the heating module 21 to explain the transfer of the wafer W by the transfer arm 30, a numeral 23 in the drawing denotes a heating plate on which the wafer W is to be mounted. A numeral 24 denotes a raising and lowering pin which is raised and lowered by a raising and lowering mechanism 25 to deliver the wafer W between the fork 3A, 3B and the heating plate 23. In other words, the wafer W moved to the heating plate 23 is vertically moved from the position held by the fork 3 and delivered to the heating plate 23.

Figure 9:
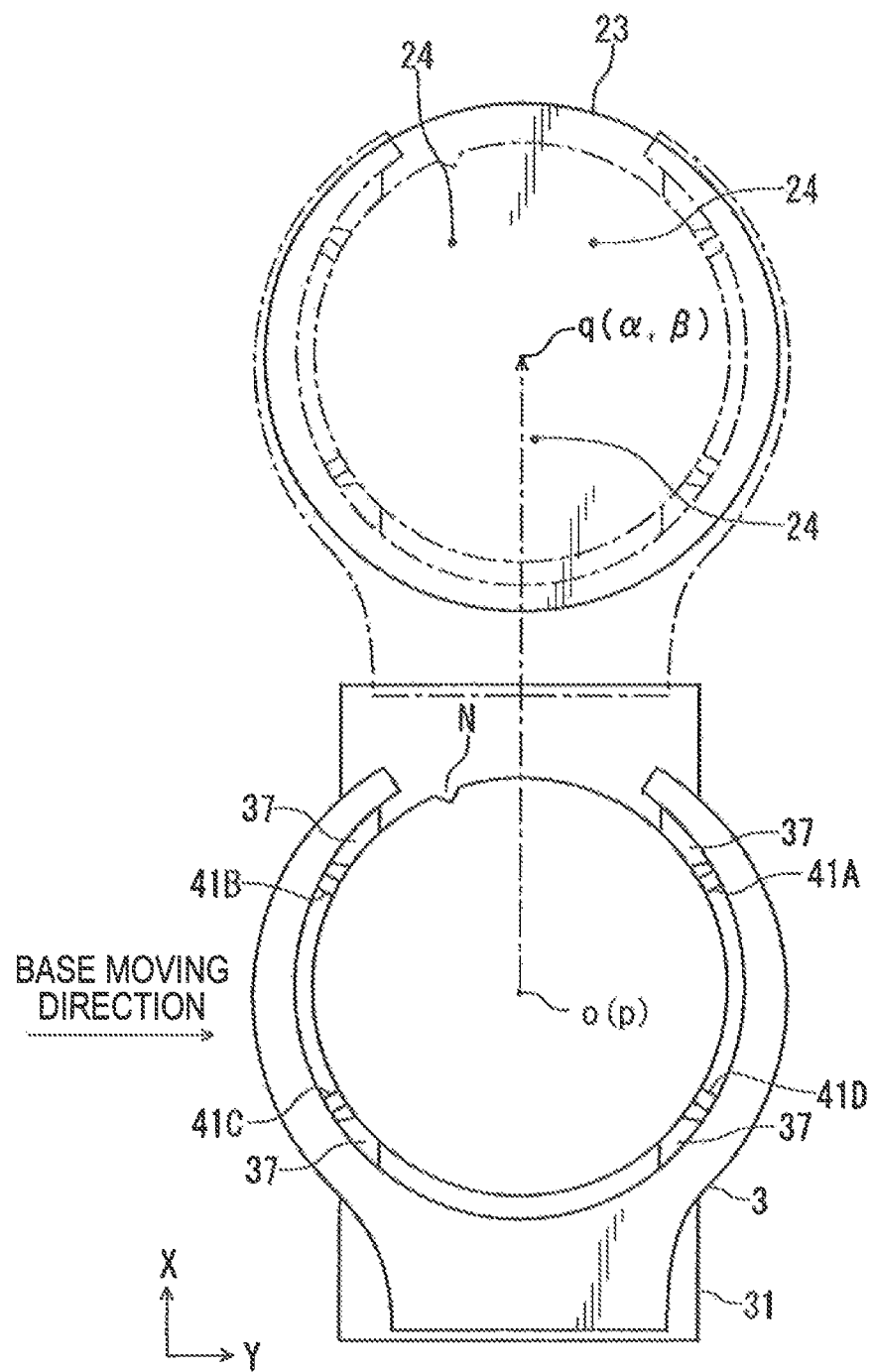
FIG. 9 is a schematic view of transfer by the transfer arm.

Here, the outline of the transfer of the wafer from the resist coating module COT to the heating module 21 by the transfer arm 30 will be explained referring to FIG. 9, FIG. 10. In the drawings in FIG. 9 and subsequent thereto, the fork 3 and the base 31 are illustrated while being slightly simplified for explanation. As described above, the fork 3 holds the wafer W to surround the side periphery of the wafer W delivered from the resist coating module COT. When the wafer W is held in this manner, if a center position o of the wafer W when mounted on the fork 3 as illustrated in FIG. 9 vertically aligns with a preset appropriate position p of the fork 3, the base 31 and the fork 3 move so that the appropriate position p of the fork 3 vertically aligns with an appropriate position q (indicated as coordinates (a) in the drawing) of the heating plate 23, whereby the wafer W can be mounted so that the center position a of the wafer W vertically aligns with the appropriate position q, namely, at an appropriate position of the heating plate 23.

Figure 10:
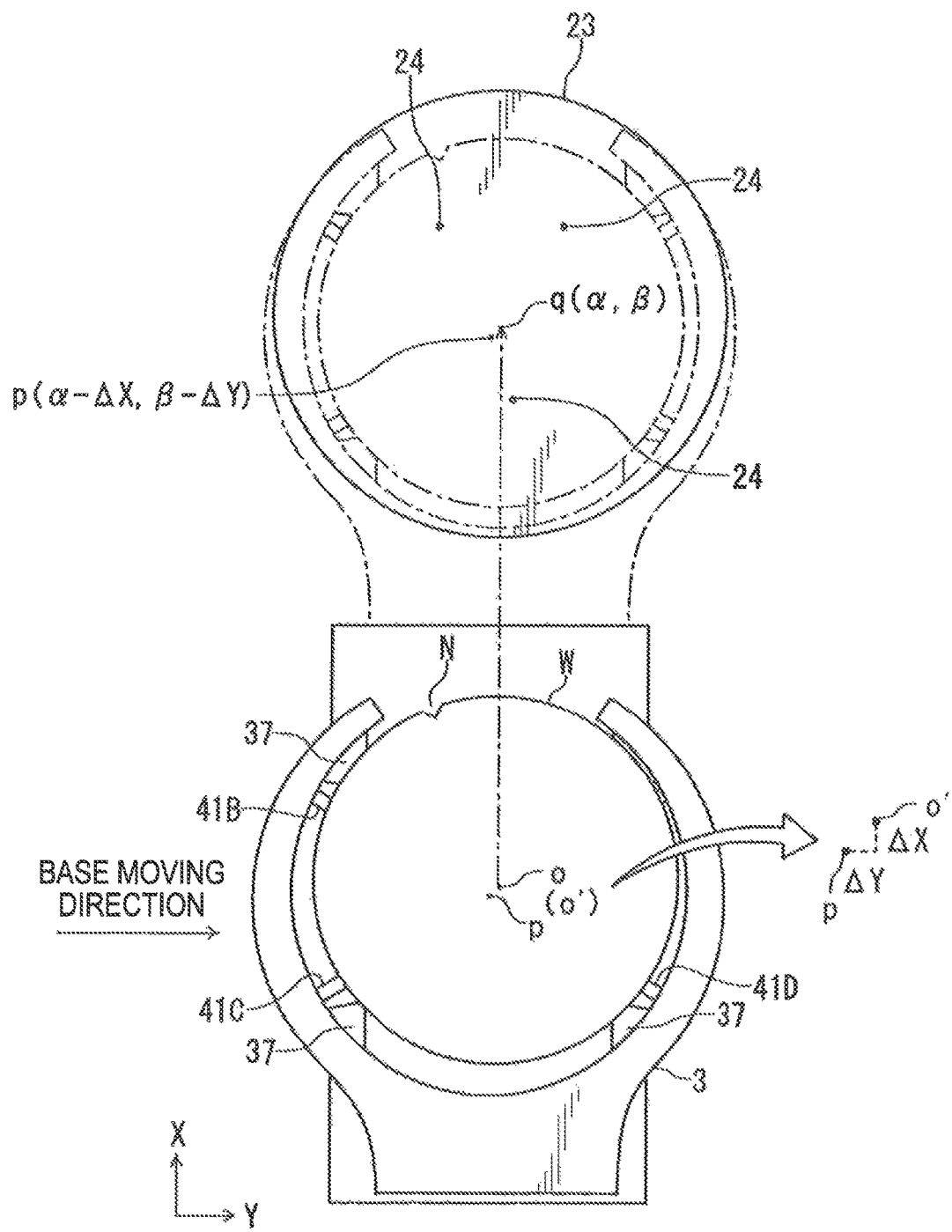
FIG. 10 is a schematic view of transfer by the transfer arm.

However, in the case where the center position o of the wafer W is displaced from the appropriate position p of the fork 3 as illustrated in FIG. 10, if the base 31 and the fork 3 move so that the appropriate position p of the fork 3 vertically aligns with the appropriate position q of the heating plate 23, the wafer W will be delivered with the center position a of the wafer W displaced from the appropriate position q of the heating plate 23 by the displace amount between the center position o of the wafer W and the appropriate position p of the fork 3. The displacement amounts of the center position o of the wafer W with respect to the appropriate position p in the X-direction and the Y-direction in the drawing are $\Delta X$ and $\Delta Y$ respectively. Further, the center position o when displaced from the appropriate position as described above is indicated as o'.

Hence, the coordinate positions of the edge portion of the wafer W in the XY-plane are detected by the detection parts 4, and the center position (center coordinates) o' of the wafer W in the XY-plane is obtained by calculation on the basis of the detection results. Then, at the time when the wafer W is delivered to the heating module 21, the position in the Y-direction of the base 31 and the position in the X-direction of the fork 3 are controlled so that the displace amounts between the center position o' and the appropriate position p of the fork 3 are eliminated.

FIG. 10 illustrates an example where the center position o' is displaced from the appropriate position p by $\Delta X$ to the heating plate 23 side and $\Delta Y$ in the moving direction of the base 31 from the resist coating module COT. In this case, the positions of the fork 3 and the base 31 are corrected so that the appropriate position p of the fork 3 at the delivery of the wafer V to the heating plate 23 is set to ($\alpha$-$\Delta X$, $\beta$-$\Delta Y$) that is displaced by $\Delta X$, $\Delta Y$ from the coordinates ($\alpha$, $\beta$) of the appropriate position q of the heating plate 23. In other words, the position of the fork 3 when delivering the wafer W with respect to the heating plate 23 is changed to correspond to the displacement amounts between the center position o' and the appropriate position p. Thus, the wafer W is delivered so that the center position o' of the wafer W vertically aligns with the appropriate position q of the heating plate 23. The coordinate data on the appropriate position q of the module is stored in the storage part 55 of the control part 5, and calculation is performed so that the delivery is performed on the basis of the thus stored data.

Figure 11:
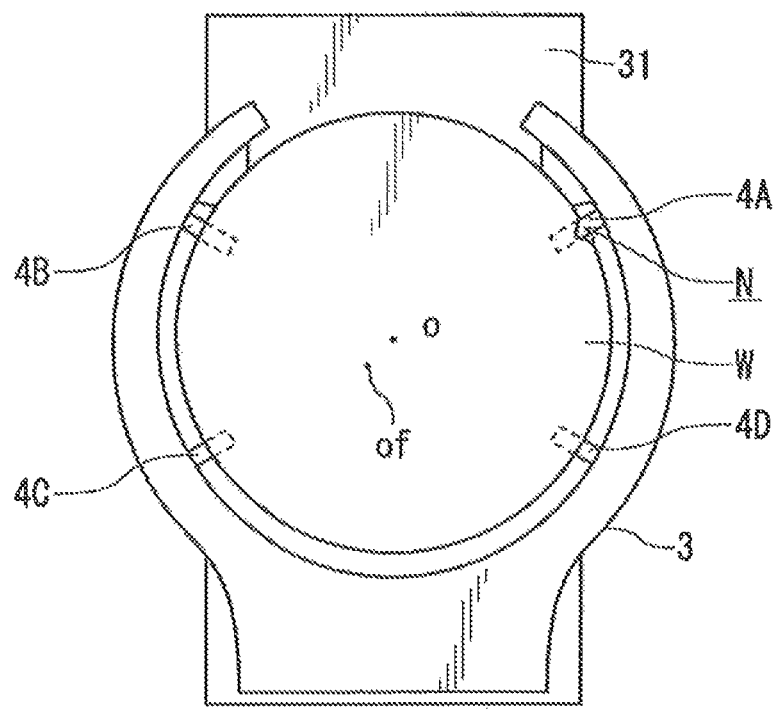
FIG. 11 is a plan view illustrating the positional relationship between a holding part of the transfer arm and a wafer held by the holding part.

However, since the wafer W is provided with the notch N as described above, the detection range of any one of the detection parts 4A to 4D overlaps with the notch N, for example, as illustrated in FIG. 11 when the fork 3 is located at the retracted position, namely, the light from the light source part 41 is applied to the notch N in some case. FIG. 11 illustrates an example where the detection range of the detection part 4A overlaps with the notch N. In this case, the detection part 4A overlapping with, the notch N detects a position inside the outer shape of the wafer W as the position of the edge portion, and therefore the center position calculated using the detection result of the detection part 4A (indicated as of in the drawing) is displaced from the actual center position o. To prevent such a situation, the control part 5 is provided with a function of determining whether or not the notch N overlaps with the detection range, and when determining that there is an overlap, moving the fork 3 to displace the notch N from the position of the detection part 4, and calculating the center position again.

Then, when all of the detection parts 4A to 4D are usable, the control part 5 executes the normal mode by the program 56, and when one of the detection parts 4A to 4D becomes unusable due to fault or the like, executes the temporary mode by the program 57. The modes execute the determination of an overlap of the notch N and the calculation of the center position by respective different processes.

Figure 12:
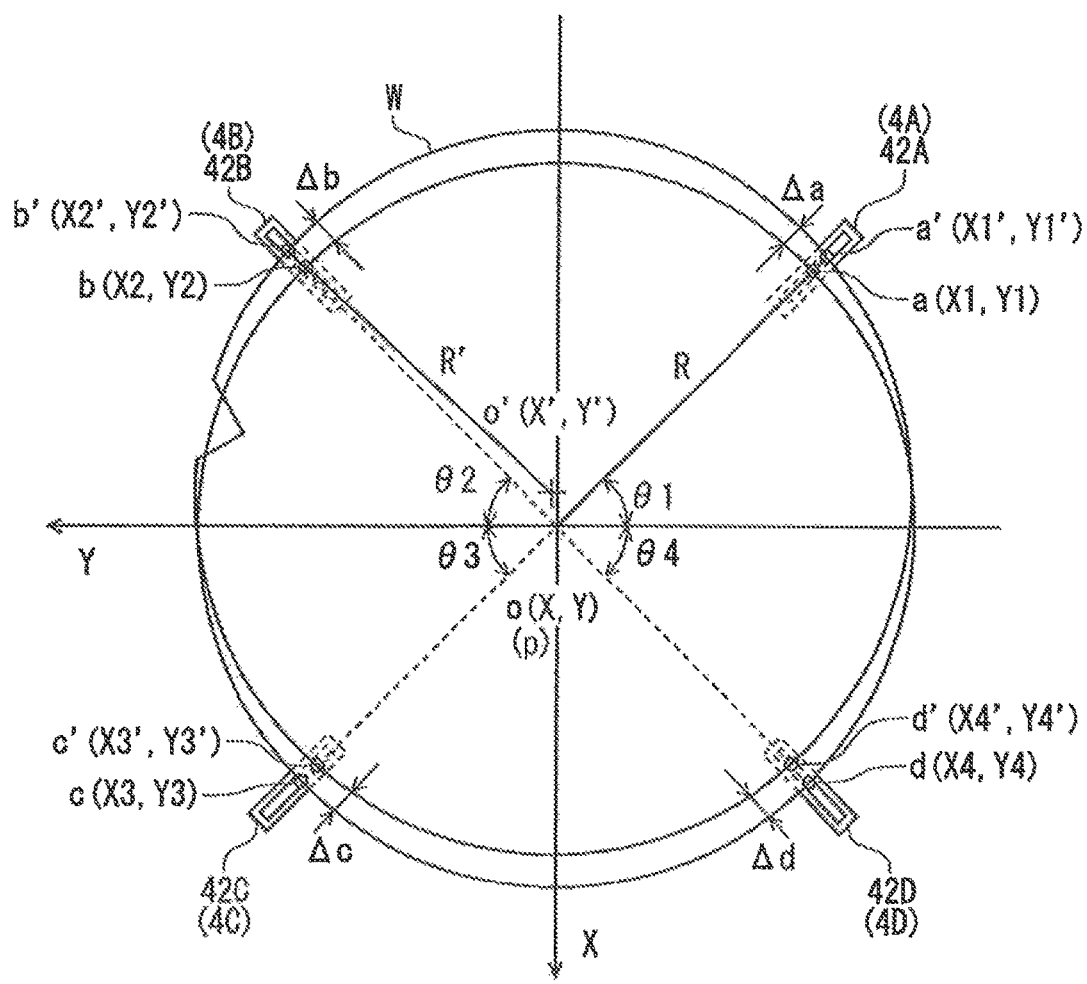
FIG. 12 is a plan view illustrating coordinates of a wafer calculated on the basis of detected edge positions.

Before explanation of how to perform the determination of an overlap of the notch N, the method of calculating the coordinates of the center position (center coordinates) from the positions of the edge portion of the wafer W will be explained referring to FIG. 12. The positions of the edge portion of the wafer W on the light receiving parts 42 when the center position o of the wafer W is located to vertically align with the already-described appropriate position p of the fork 3 are indicated as an a point, a b point, a c point, and a d point respectively. Further, angles formed between directions in which the four light receiving parts 42A to 42D extend and the Y-axis are θ1, θ2, θ3, θ4.

Further, the position of the held wafer W when the held wafer W is displaced with respect to the appropriate position p is a displacement position, and the positions of the edge portion of the wafer W at the displacement position on the light receiving parts 42 are an a' point, a b' point, a c' point, a d' point respectively.

The distances between the a point, the b point, the c point, the d point and the a' point, the b' point, the c' point, the d' point on the light receiving parts 42 are Δa, Δb, Δc, Δd respectively. In this event, Δa, Δb, Δc, Δd are $$\Delta a \text{ [mm]} = \{(\text{the number of pixels at the } a' \text{ point}) - (\text{the number of pixels at the } a \text{ point})\} \times \text{pixel interval [mm]} \quad (1)$$

$$\Delta b \text{ [mm]} = \{(\text{the number of pixels at the } b' \text{ point}) - (\text{the number of pixels at the } b \text{ point})\} \times \text{pixel interval [mm]} \quad (2)$$

$$\Delta c \text{ [mm]} = \{(\text{the number of pixels at the } c' \text{ point}) - (\text{the number of pixels at the } c \text{ point})\} \times \text{pixel interval [mm]} \quad (3)$$

$$\Delta d \text{ [mm]} = \{(\text{the number of pixels at the } d' \text{ point}) - (\text{the number of pixels at the } d \text{ point})\} \times \text{pixel interval [mm]} \quad (4)$$

Note that, for example, the number of pixels at the a point means the number of pixels from the start point on the center side of the wafer W at the light receiving part 42 to the a point.

Then, the coordinates of the a point to the d point and the a' point to the d' point are expressed as following Expressions (5) to (12). In Expressions, R is the radius of the wafer W. Further, X, Y are coordinates of the appropriate position p when the fork 3 has received the wafer W at the delivery position from each module and moved to the retracted position, namely, an X-coordinate, a Y-coordinate of the center position o when the wafer W is appropriately held by the fork 3. The value of R and the coordinates of o are preset known values.

$$a \text{ point } (X1, Y1) = (X - R\sin\theta1, Y - R\cos\theta1) \quad (5)$$

$$a' \text{ point } (X1', Y1') = (X1 - \Delta a\sin\theta1, Y1 - \Delta a\cos\theta1) = (X - (R + \Delta a)\sin\theta1, Y - (R + \Delta a)\cos\theta1) \quad (6)$$

$$b \text{ point } (X2, Y2) = (X - R\sin\theta2, Y + R\cos\theta2) \quad (7)$$

$$b' \text{ point } (X2', Y2') = (X2 - \Delta b\sin\theta2, Y2 + \Delta b\cos\theta2) = (X - (R + \Delta b)\sin\theta2, Y + (R + \Delta b)\cos\theta2) \quad (8)$$

$$c \text{ point } (X3, Y3) = (X + R\sin\theta3, Y + R\cos\theta3) \quad (9)$$

$$c' \text{ point } (X3', Y3') = (X3 + \Delta c\sin\theta3, Y3 + \Delta c\cos\theta3) = (X + (R + \Delta c)\sin\theta3, Y + (R + \Delta c)\cos\theta3) \quad (10)$$

$$d \text{ point } (X4, Y4) = (X + R\sin\theta4, Y - R\cos\theta4) \quad (11)$$

$$d' \text{ point } (X4', Y4') = (X4 + \Delta d\sin\theta4, Y4 - \Delta d\cos\theta4) = (X + (R + \Delta d)\sin\theta4, Y - (R + \Delta d)\cos\theta4) \quad (12)$$

Accordingly, coordinates of the a' point (X1', Y1'), the b° point (X2') Y2'), the c' point (X3', Y3'), and the d' point (X4', Y4') can be found by Expression (6), Expression (8), Expression (10), and Expression (12).

From any three points of thus calculated a' point, b' point, c' point, d' point, coordinates (X', Y') of the center position o' of the wafer W at the displacement position can be calculated. For example, the expressions of calculating the coordinates (X', Y') of the center position o' at the displacement position, for example, from the three points of the a' point (X1', Y1'), the b' point (X2', Y2'), the c' point (X3', Y3') are expressed by following Expression (13) and Expression (14).

$$X' = \frac{X1'^2(Y3' - Y2') + X2'^2(Y1' - Y3')X3'^2(Y2' - Y1') - (Y1' - Y3')(Y3' - Y2')(Y2' - Y1')}{2\{X1'(Y3' - Y2') + X2'(Y1' - Y3') + X3'(Y2' - Y1')\}} \quad (13)$$

$$Y' = \frac{Y1'^2(X2' - X3') + Y2'^2(X3' - X1') + Y3'^2(X1' - X2') - (X2' - X3')(X3' - X1')(X1' - X2')}{2\{Y1'(X2' - X3') + Y2'(X3' - X1') + Y3'(X1' - X2')\}} \quad (14)$$

Incidentally, to perform the determination between an overlap of the notch N and the detection range of the detection part 4, a radius of the wafer W that is calculated from the center position calculated from the three edge positions and one of the three edge positions is used. For example, when the center coordinates are calculated from the a' point, the b' point, the c' point, the radius R' is calculated by following Expression (15).

$$R' = \sqrt{\{(X'-X2')^2 + (Y'-Y2')^2\}} \quad (15)$$

In the above Expression (15), the radius R' is calculated from the center coordinates o' and the coordinates of the b' point. However, when the center coordinates o' are calculated from the three edge positions, which edge coordinates among those of the edge positions are used to calculate the radius are decided in advance. For example, the coordinates of the a' point are used when the center coordinates o' are calculated from the coordinates of the a' point, the b' point, the d' point, and the coordinates of the c' point are used when the center coordinates o' are calculated from the coordinates of the b' point, the c' point, the d' point, and the coordinates of the d' point are used when the center coordinates o' are calculated from the coordinates of the a' point, the c' point, the d' point.

Figure 13:
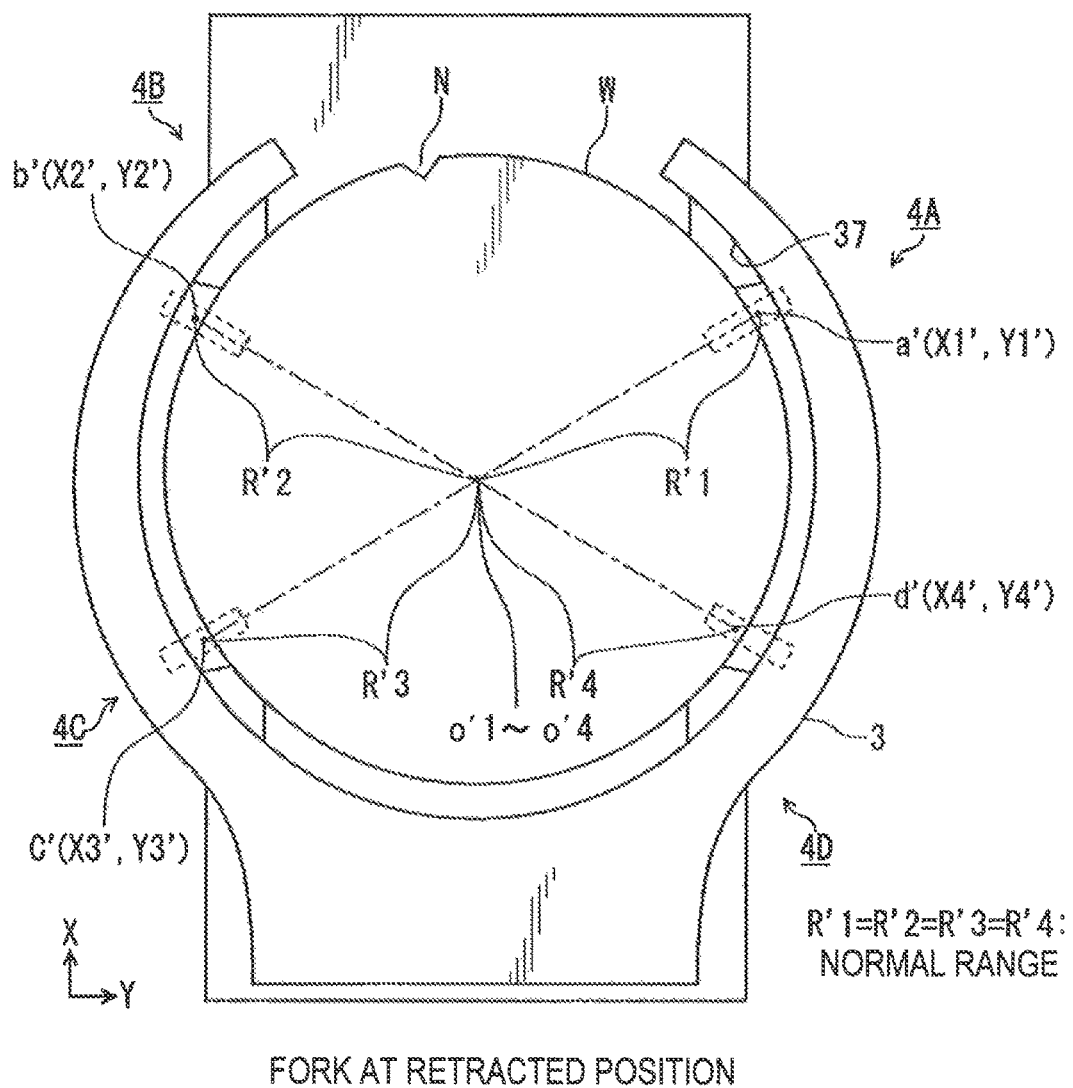
FIG. 13 is a plan view illustrating coordinates of the wafer.

Next, the method of determining the presence or absence of an overlap between the notch N and the detection range of the detection part 4 and the handling when there is an overlap as a result of the determination in the normal mode will be explained. For convenience of explanation, the center coordinates (center position) and the radius calculated from the a' point, the b' point, the d' point are o'1 and R'1 respectively, and the center coordinates and the radius calculated from the a' point, the b' point, the c' point are o'2 and R'2 respectively. Further, the center coordinates and the radius calculated from the b' point, the c' point, the d' point are o'3 and R'3 respectively, and the center coordinates and the radius calculated from the a' point, the c' point, the d' point are o'4 and R'4 respectively. FIG. 13 illustrates an example of the positional relationship between the wafer W and the detection parts 4 in which the fork 3 holding the wafer W is located at the retracted position (reference position). The notch N does not overlap with any of the detection ranges of the detection parts 4A to 4D. In this case, when four center positions o' (o'1 to o'4) and radii R' (R'1 to R'4) are obtained using three of the a' to d' points as described above, the four radii R' fall within a normal range, and a value of maximum value–minimum value of them is therefore equal to or less than a preset threshold value. Therefore, the control part 5 determines that the detection parts 4 do not overlap with the notch N, calculates an average value of the obtained four center positions o'1 to o'4, and sets the calculated value as the center position o'.

Figure 14:
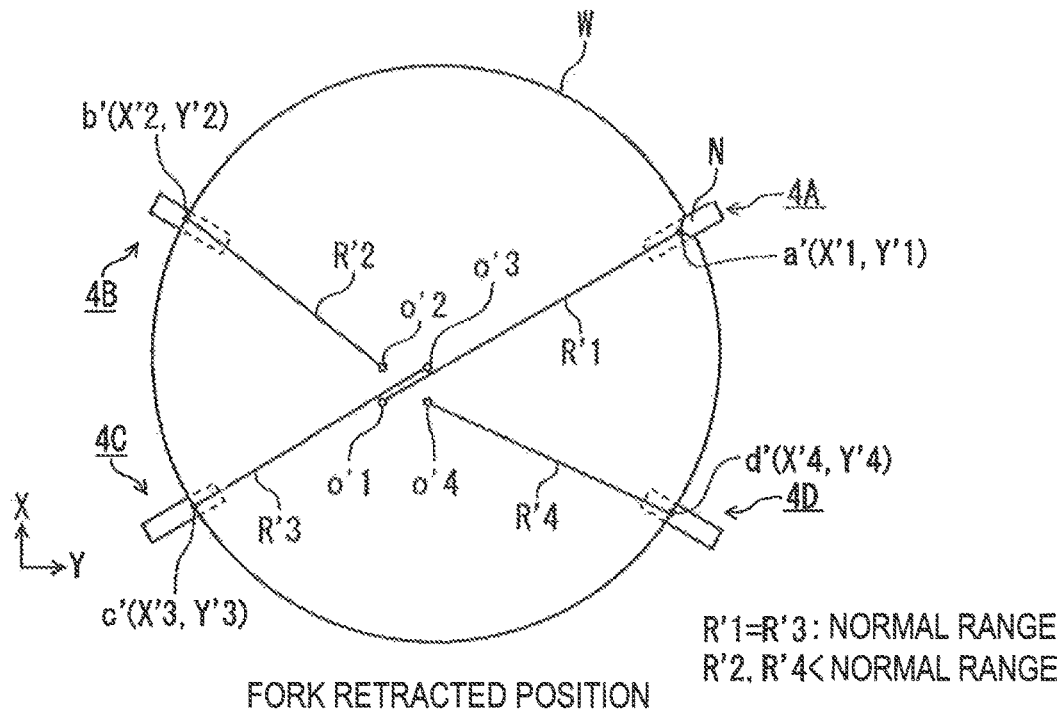
FIG. 14 is a plan view illustrating coordinates of the wafer.

FIG. 14 illustrates another example of the positional relationship between the wafer W and the detection parts 4 in which the notch N overlaps with the detection range of the detection part 4A. FIG. 14 illustrates the center positions o'1 to o'4 calculated at this time. Since an overlap occurs at this time, two of the radii R'1 to R'4 are shorter than the actual radius of the wafer W that is a known value. In the example illustrated in FIG. 14, R'2 and R'4 are thus shorter. Accordingly, the calculated value of maximum value–minimum value of the radius R' is larger than threshold value. Consequently, it can be determined that the notch N overlaps with the detection range of any of the detection parts 4A to 4D.

The radius R' calculated using the detection parts 4 whose detection ranges do not overlap with the notch N has a normal value that is the same as the actual radius as a matter of course. However, even the radius R' calculated using the data of the detection part 4 overlapping with the notch N sometimes falls within the normal range due to displacement of the calculated center position o' from the actual center position of the wafer W to the cutout direction of the notch N. The radius R'3 obtained from the b' point, the c' point, the d' point corresponds to that case in the example in FIG. 14.

Figure 15:
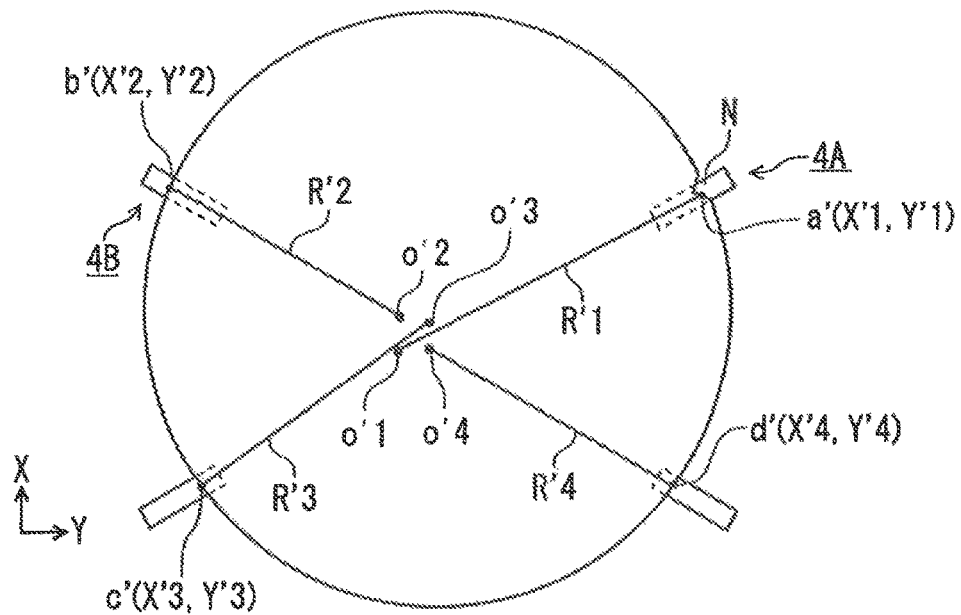
FIG. 15 is a plan view illustrating coordinates of the wafer.

Hence, to specify the detection part not overlapping with the notch N, the control part 5 causes the fork 3 to slightly advance to displace the positions of the detection parts 4 and the wafer W as illustrated in FIG. 15. The distance of the advance is, for example, 1 mm, and the position advanced in this manner is a first slightly advanced position. The control part 5 calculates again the center positions o'1 to o'4 and the radii R'1 to R'4 at the first slightly advanced position.

Figure 16:
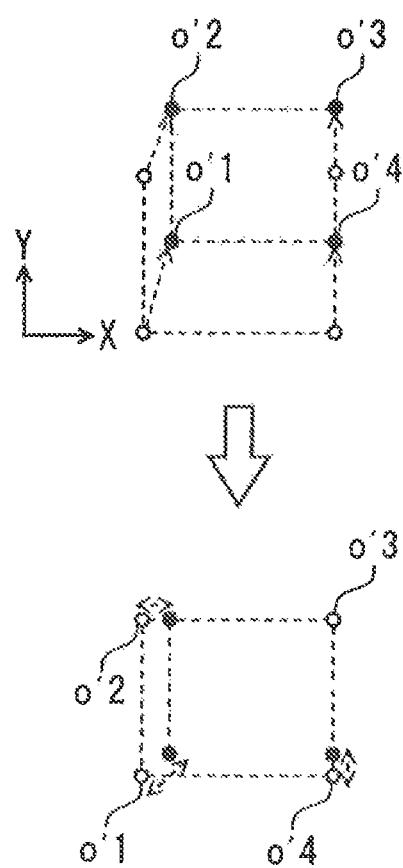
FIG. 16 is an explanatory view illustrating the appearance that center coordinates of the wafer change.

An upper section of FIG. 16 illustrates the appearance that the center positions o'1 to o'4 move in XY-coordinates, for example, taking a predetermined position of the base 31 as an original point. In the drawing, the center positions o'1 to o'4 obtained at the retracted position are indicated by white points, and the center positions o'1 to o'4 obtained at the first slightly advanced position are indicated by black points. Comparing the center positions o' at the retracted position with the center positions o' at the first slightly advanced position, the positions in the Y-direction of some of the center positions o' calculated using the detection part 4 overlapping with the notch N move because of change of the positions of the detection parts 4 with respect to the notch N, as illustrated in the drawing.

A lower section of FIG 16 is a conceptual view illustrating the movements of the center positions o'1, o'2, o'4 incorrectly detected due to the notch N as seen from the correctly detected center position o'3 when the wafer V is moved such that the notch N gradually gets out of the detection range of the detection part 4A, and illustrates the movement of each coordinates o' after subtracting therefrom the movement amount of the fork 3 between the retracted position and the first slightly advanced position. The center positions incorrectly calculated as described above move as if to approach the correctly calculated center position. Note that when the wafer W is moved so that the overlap of the detection range of the detection part 4A with the cutout of the notch N gradually increases, the other center positions o'1, o'2, o'4 move to separate from the correctly calculated center position o'3.

Then, the center position calculated from the combination of the detection parts 4 (4B, 4C, 4D in this example), including the detection part 4 overlapping with the notch N at the retracted position as described above and calculating the same radius R' as the normal value, changes in the Y-direction because the detection position with respect to the notch N varies between the inside and the outside of the wafer W. More specifically, the detection parts 4 in combination by which the radius R' calculated at the retracted position has the normal value and no change occurs in the Y-direction in comparison between the center positions o' calculated at the retracted position and at the first slightly advanced position can be specified as the detection parts 4 not overlapping with the notch N, and the center position o' obtained from the combination can be decided as the correct center position of the wafer W. Also in the case where the detection part 4 other than the detection part 4A overlaps with the notch N, the center position of the wafer W is specified in the similar manner.

The storage part 55 of the control part 5 stores data on the coordinates at the edge positions, the center coordinates o'1 to o'4, and the radii R'1 to R'4 obtained by the detection parts 4A to 4D at each of the reference position (retracted position) and the first slightly advanced position as illustrated in FIG. 8 to be able to perform the above calculation. Further, to enable the determination of the presence or absence of change in the Y-direction of the center position as described above, a region is provided which stores the calculation result of the difference in a Y component of the center coordinates between the reference position and the first slightly advanced position. The control part 5 recognizes that there is a change in the Y component when the calculated difference exceeds a predetermined range, and recognizes that there is no change when the difference does not exceed the range.

Figure 17:
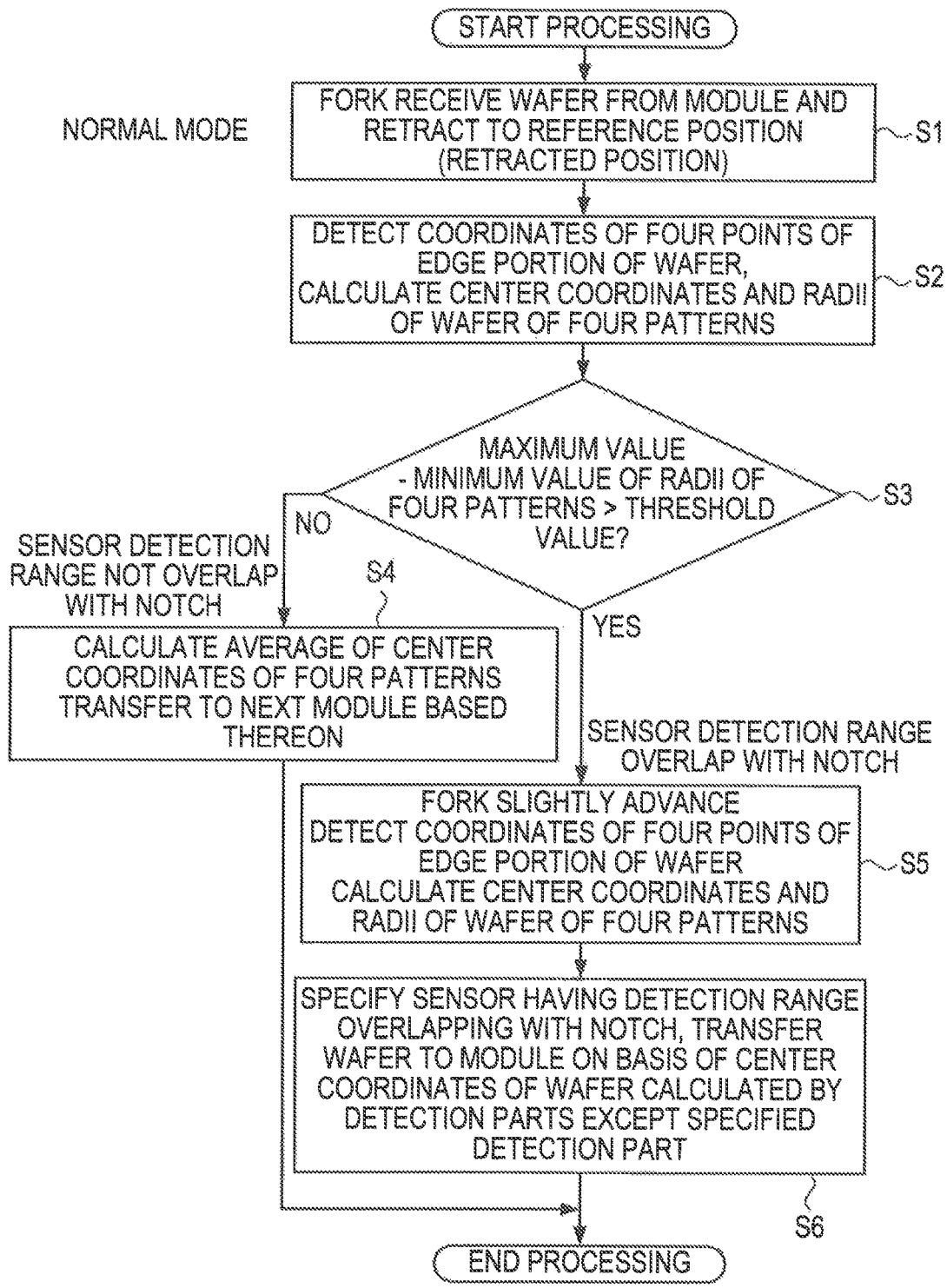
FIG. 17 is a flowchart in a normal mode performed by the transfer arm.

Though the detection method of the notch N using the detection parts 4A to 4D and the calculation method of the normal center position have been explained, a series of operations in the normal mode will be explained along the flow in FIG. 17 taking, as an example, the transfer of the wafer W from the resist coating module COT to the heating module 21. The base 31 is located to face the resist coating module COT, and the fork 3A advances from the base 31 to the delivery position and receives a wafer W from the resist coating module COT, and then moves to the retracted position (Step S1). The light source parts 41 of the detection parts 4A to 4D apply light to the light receiving parts 42, and the detection parts 4A to 4D obtain the coordinates of the edge positions of the wafer W. Then, on the basis of the coordinates of the edge positions, the center coordinates o'1 to o'4 and the radii R'1 to R'4 are calculated and stored (Step S2). The control part 5 uses the maximum value and the minimum value of the radii R'1 to R'4 and determines whether or not the value of maximum value–minimum value is larger than the preset threshold value (Step S3).

When it is determined that the value is not larger than the threshold value, it is determined that the detection range of any of the detection parts 4 does not overlap with the notch N, and the respective average values of the X components and the Y components of the center coordinates o'1 to o'4 are calculated, and the average values are set as the center coordinates o' (X', Y'). Then, as has been explained for FIG.

10, the displacement amounts $\Delta X$ and $\Delta Y$ with respect to the appropriate coordinates p(X, Y) of the fork 3A are calculated.

$$\Delta X \text{ (mm)} = X' - X \quad (16)$$

$$\Delta Y \text{ (mm)} = Y' - Y \quad (17)$$

Then, as has been explained for FIG. 10, the coordinate position of the appropriate position p of the fork 3 when delivering the wafer W are calculated, on the basis of the $\Delta X$ and $\Delta Y$ and the coordinates of the appropriate position of the heating plate 23 of the heating module 21, so that the center coordinates o' vertically align with the appropriate position q of the heating plate 23 of the heating module 21. In short, the position of the base 31 and the position of the fork 3 when delivering the wafer W are calculated. Then, the base 31 moves to the position calculated as described above, and the fork 3 advances to the calculated position toward the heating module and mounts the wafer W so that the center position o' of the wafer W vertically aligns with the appropriate position q of the heating plate 23 (Step S4).

When the value of maximum value−minimum value of the calculated radius R' is determined to be larger than the threshold value at Step S3, it is determined that the detection range of any of the detection parts 4 overlaps with the notch N. The fork 3A advances to the first slightly advanced position, the light sources 41 apply light, and the detection parts 4A to 4D obtain the coordinates of the edge positions similarly at Step S2. Then, the center coordinates o'1 to o'4 and the radii R'1 to R'4 at the first slightly advanced position are calculated (Step S5). Then, the difference between the Y components of the center coordinates obtained respectively at the retracted position and the first slightly advanced position are calculated.

The combination of the detection parts 4 by which the radius R calculated at the retracted position falls within the normal range and the difference in the Y component falls within the preset range is specified, and the center coordinates o' calculated by the combination is set as the actual center coordinates o'. For the center coordinates after specifying the combination, the data calculated at the above Step S2 may be used or the data calculated at this Step S6 may be used. Then, similarly at Step S4, the displacement amounts $\Delta X$ and $\Delta Y$ with respect to the appropriate position p of the fork 3 are calculated, and the wafer W is transferred so that the center coordinates o' vertically align with the appropriate position q of the heating plate 23 (Step S6). The above series of operations are controlled by the normal mode execution program 56.

Subsequently, the method of determining the presence or absence of an overlap between the notch N and the detection range of the detection part 4 and the handling when there is an overlap as a result of the determination in the temporary mode will be explained. As in the normal mode, the fork 3 holding the wafer W moves to the retracted position, three detection parts 4 among the four detection parts 4A to 4D except the unusable detection part are used to detect the edge positions of the wafer W, and the radius R' and the center coordinates o' of the wafer W are calculated on the basis of the edge positions. Thereafter, the fork 3 moves to the first slightly advanced position, the three detection parts 4 are used to detect the edge positions of the wafer W, and the radius R' and the center coordinates o' of the wafer W are calculated on the basis of the edge positions.

Here, if the detection range of one of the three detection parts 4 overlaps with the notch N at the retracted position or the first slightly advanced position as has been explained in the normal mode, the radius R' calculated in the overlap state sometimes becomes smaller than the normal range. Further, even if both the radii R' calculated at the retracted position and the first slightly advanced position fall within the normal range, the Y component of the center coordinates o' changes between the retracted position and the first slightly advanced position.

As has been described, the radius R' of the wafer W is obtained as the distance between the center coordinates o' and the coordinates detected by the detection part 4 located at the middle in the arrangement direction of the three detection parts 4 where the arrangement interval is shortest as seen in the peripheral direction of the wafer W. Thus, when the detection range of any of the detection parts 4 adjacent in the peripheral direction to the unusable detection part 4 overlaps with the notch N, the radius R' becomes smaller than the actual radius. When the detection range of the detection part 4 opposite to the unusable detection part 4 across the center of the wafer W overlaps with the notch N, the radius R' falls within the normal range but the Y component varies.

Figure 18:
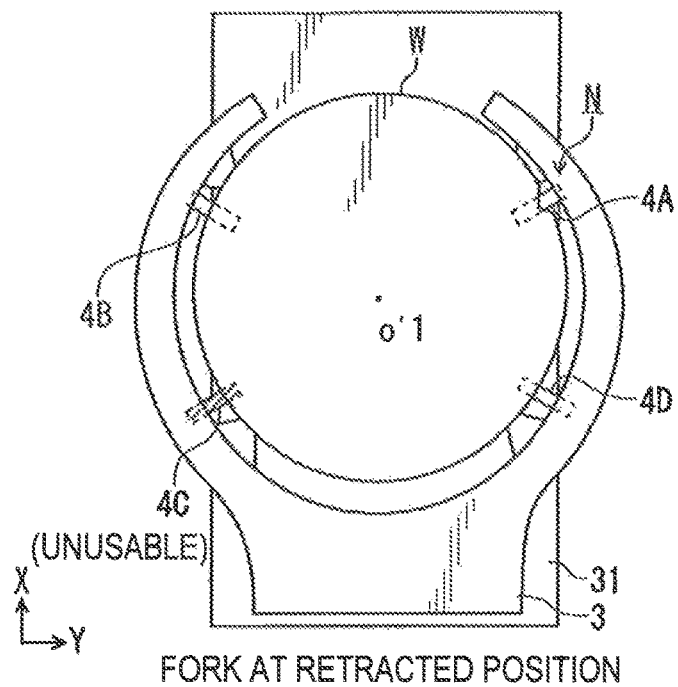
FIG. 18 is an explanatory view illustrating an operating state of the holding part during execution of a temporary mode.
Figure 19:
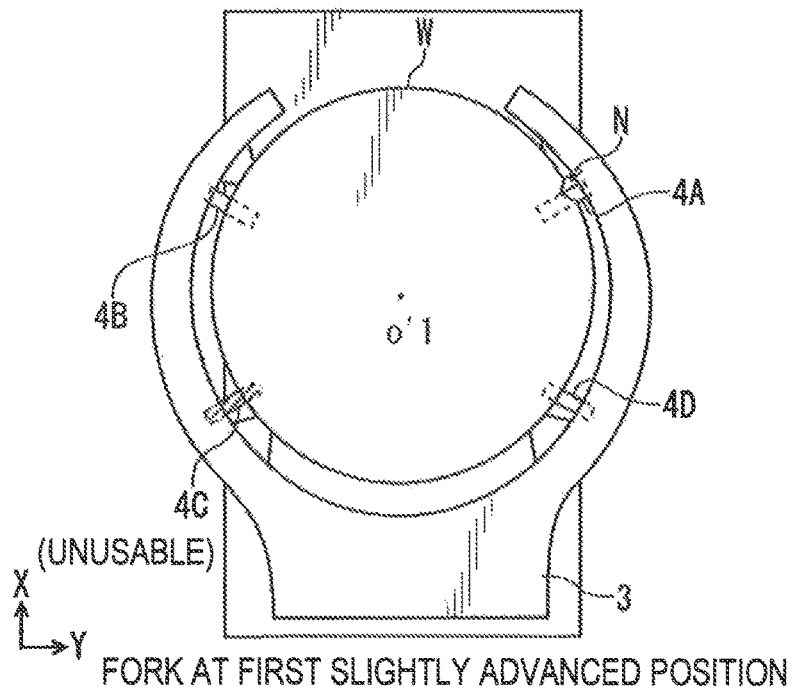
FIG. 19 is an explanatory view illustrating the operating state of the holding part during execution of the temporary mode.

FIG. 18 illustrates an example where the detection part 4C becomes unusable, in which the detection range of the detection part. 4A overlaps with the notch N when the fork 3 is located at the retracted position. FIG. 19 illustrates a state that the fork 3 has moved to the first slightly advanced position. As illustrated in FIG. 18, FIG. 19, the position of the notch N with respect to the detection part 4A is displaced, whereby the position of o'1 calculated by the detection parts 4A, 4B, 4D is displaced. Accordingly, the control part 5 recognizes that the detection part 4A overlaps with the notch N at the retracted position and/or the first slightly advanced position.

Figure 20:
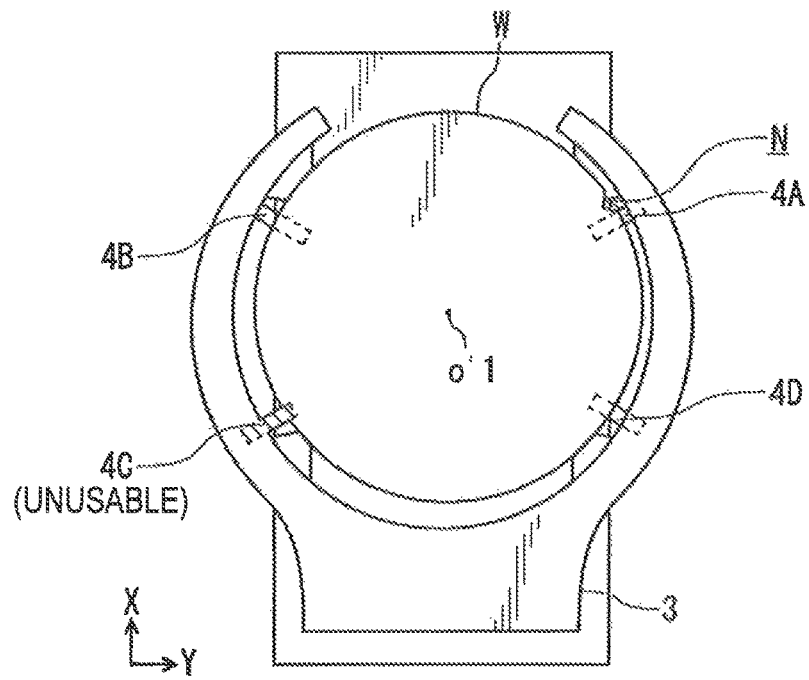
FIG. 20 is an explanatory view illustrating the operating state of the holding part during execution of the temporary mode.

Hence, the fork 3 further advances by a preset distance as illustrated in FIG. 20. The advance distance is a distance enough for the notch N to get out of the detection range. Then, at the advanced position (regarded as a second slightly advanced position), the detection parts 4A, 4B, 4D are used to detect the edge positions of the wafer W, and the accurate center position o' is calculated on the basis of the edge positions. Accordingly, the storage part 55 of the control part 5 includes a storage region for storing the edge positions at the second slightly advanced position and the center position calculated from the edge positions as illustrated in FIG. 8. Also when the detection part other than the detection part 4C becomes unusable or when the detection part 4 other than the detection part 4A overlaps with the notch N, the detection of the center position is similarly performed.

Though the case where the Y component of the center coordinates changes has been explained in FIG. 18 to FIG. 20, other cases will be explained. If both the radii R' calculated at the retracted position and the first slightly advanced position are shorter than the normal range, the notch N overlaps with the detection range of any of the detection parts 4 at the retracted position and the first slightly advanced position, so that the fork 3 is moved to the second slightly advanced position and the center coordinates are calculated as in the case of the Y component changes.

Figure 21:
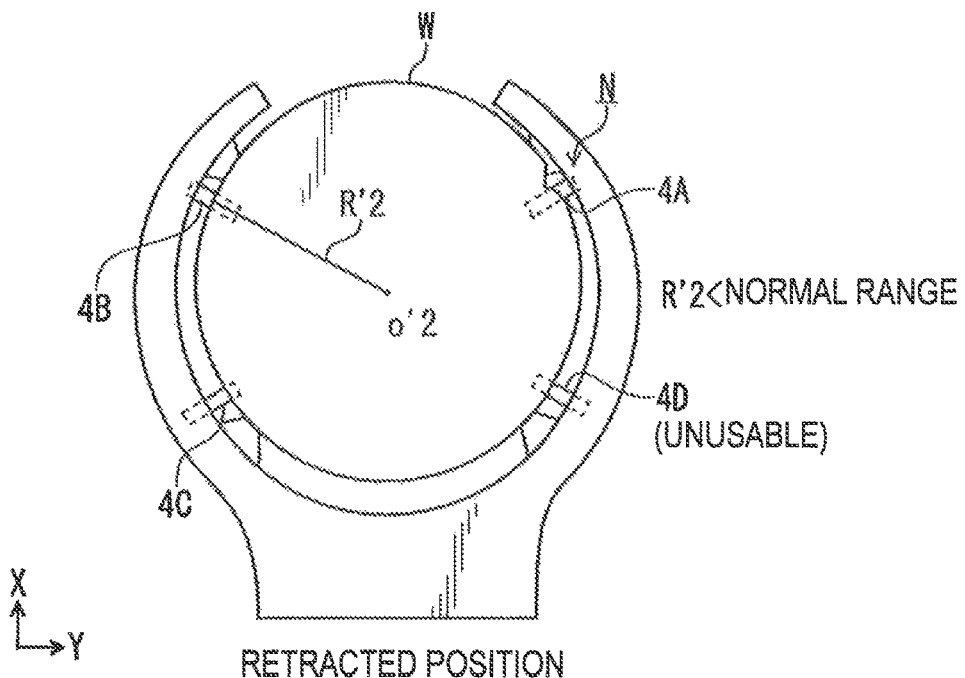
FIG. 21 is an explanatory view illustrating the operating state of the holding part during execution of the temporary mode.
Figure 22:
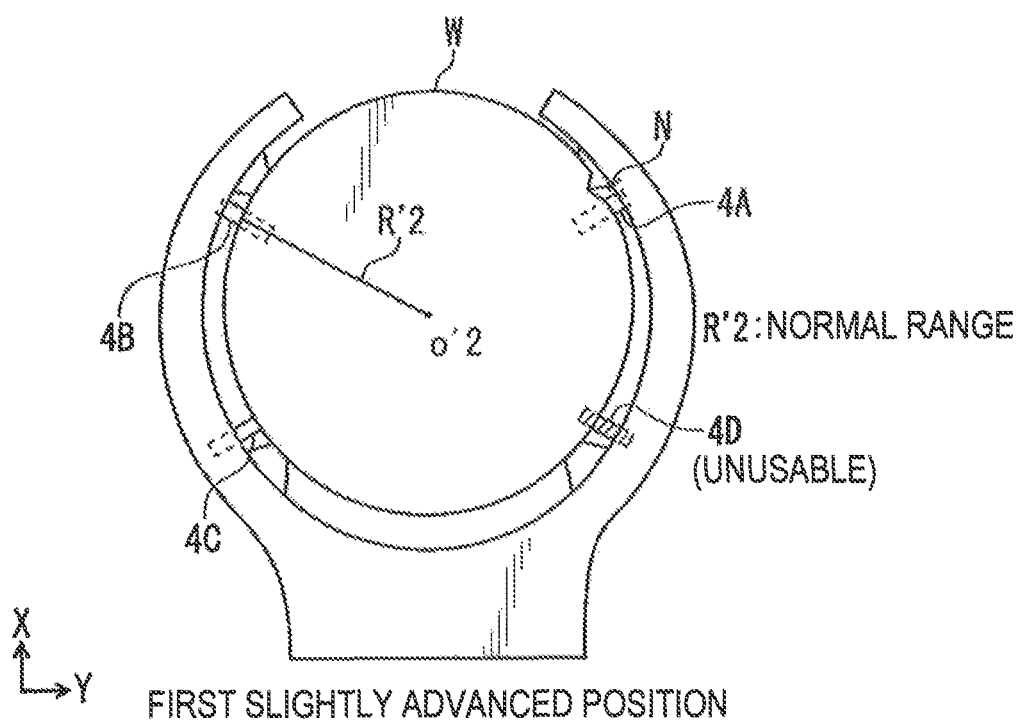
FIG. 22 is an explanatory view illustrating the operating state of the holding part during execution of the temporary mode.

The case where there is no change in the Y component of the center coordinates at the retracted position and the first slightly advanced position, only the radius R' calculated at the retracted position is smaller than the normal range, and the radius R' at the first slightly advanced position falls within the normal range shows that the detection range overlaps with the notch N at the retracted position but the detection range gets out of the notch N at the first slightly advanced position. Accordingly, the center coordinates obtained from the edge positions obtained at the first slightly advanced position are regarded as the correct center coordinates of the wafer W. FIG. 21, FIG. 22 illustrate such an example in which the detection part 4D is unusable and the notch N overlaps with the detection part 4A at the retracted position. In this case, the center coordinates o'2 obtained at the first slightly advanced position are the correct coordinates, and therefore the fork 3 is not moved to the second slightly advanced position.

The case where there is no change in the Y component of the center coordinates at the retracted position and the first slightly advanced position, only the radius R' calculated at the first slightly advanced position is smaller than the normal range and the radius R' at the retracted position falls within the normal range shows that the detection range overlaps with the notch N at the first slightly advanced position but the notch N is out of the detection range at the retracted position. Accordingly, the center position obtained from the edge positions obtained at the first slightly advanced position is regarded as the correct center position of the wafer W, and the fork 3 is not moved to the second slightly advanced position.

Figure 23:
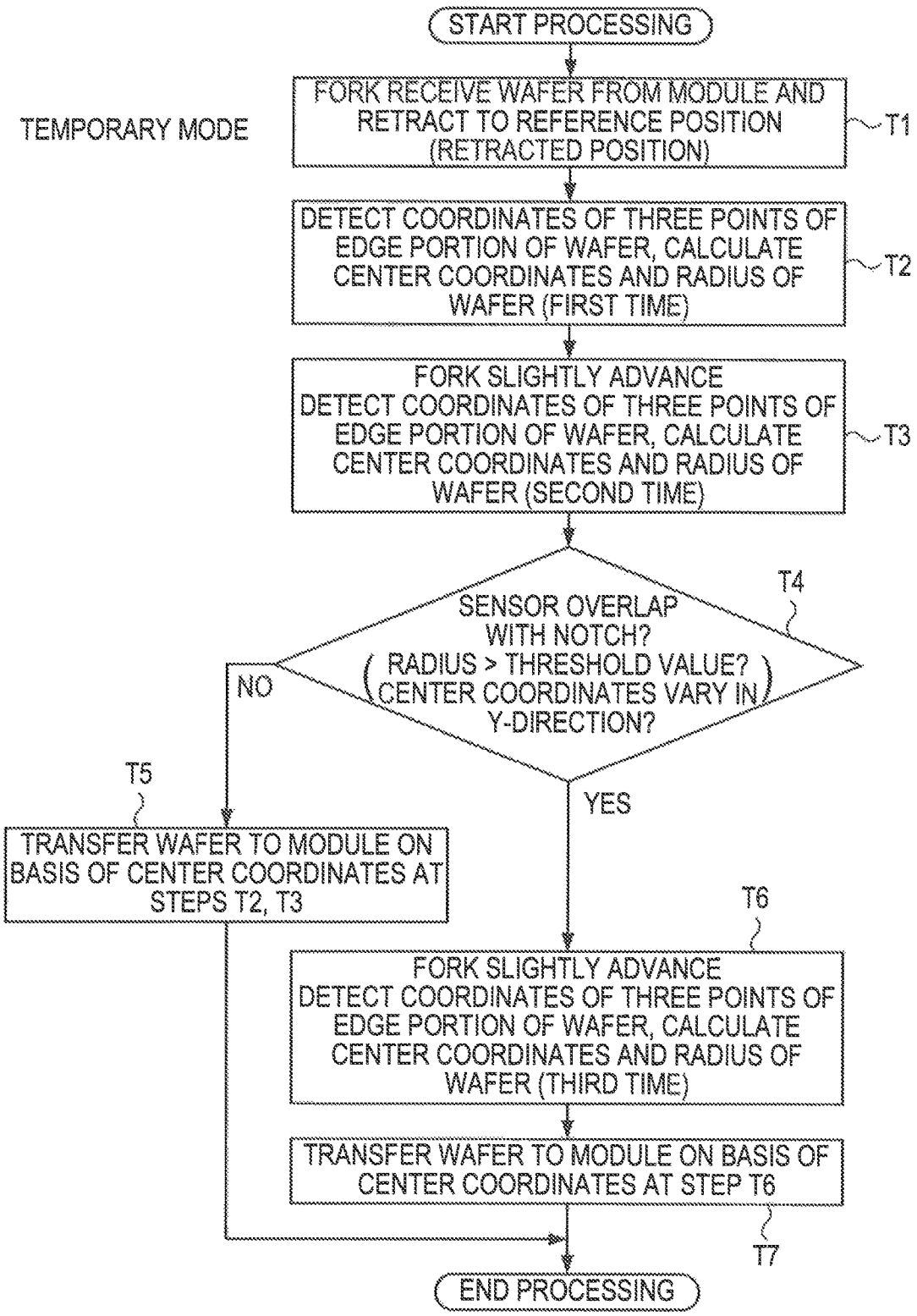
FIG. 23 is a flowchart in the temporary mode performed by the transfer arm.

A series of operations in the temporary mode will be explained along the flow in FIG. 23 taking, as an example, the transfer of the wafer W from the resist coating module COT to the heating module 21 mainly for the different points from those in the normal mode. It is assumed here that the detection part 4C is unusable as in the case of FIG. 18 to FIG. 20. Similarly at the above Step S1, for example, the fork 3A receives a wafer W from the resist coating module COT and moves to the retracted position (Step T1), the light source parts 41 apply light at the retracted position, and the detection parts 4A, 4B, 4D obtain the coordinates of the edge positions. Then, on the basis of the coordinates of the edge positions, the center coordinates o' (o'1) and the radius (R'1) are calculated (Step T2). Thereafter, the fork 3A moves to the first slightly advanced position, the light source parts 41 apply light, and the detection parts 4A, 4B, 4D obtain the coordinates of the edge positions of the wafer W at the first slightly advanced position. Then, the center coordinates o'1 and the radius R'1 are calculated on the basis of the coordinates of the edge positions (Step T3).

Thereafter, the difference between the Y components of the center positions o'1 obtained at Step T2 and Step T3 as already described is calculated and determined to fall within an allowable range. When the difference falls within the allowable range, whether or not the radii R'1 calculated at Steps T2, T3 respectively fall within the normal range is determined. In other words, whether or not the detection range of any of the detection parts 4A, 4B, 4D overlaps with the notch N at the retracted position and the first slightly advanced position is determined (Step T4). When it is determined that only one of the radii R'1 falls within the normal range, the center coordinates obtained at the same step as that for the radius R'1 are decided as the normal center coordinates. When it is determined that both of the radii R'1 fall within the normal range, any one of the center coordinates calculated at Steps T2 T3, for example, the center coordinates calculated at Step T2 are decided as the normal center coordinates. Then, on the basis of the center coordinates decided in such a manner, the wafer W is transferred as in the normal mode (Step T5).

When it is determined that the difference in the Y component of the center coordinates o'1 does not fall within the allowable range and when it is determined that the radii R'1 calculated at Steps T2, T3 do not fall within the normal range, the fork 3A is moved to the second slightly advanced position, the light source parts 41 apply light with the notch N being out of the detection ranges of the detection parts 4, and the coordinates of the edge positions of the wafer W are obtained. The center coordinates o'1 are calculated on the basis of the coordinates of the edge positions (Step T6), the displacement amounts ΔX and ΔY with respect to the appropriate position p of the fork 3A are calculated on the basis of the center coordinates o'1 calculated at Step T6, and the wafer W is transferred so that the center coordinates o'1 vertically align with the appropriate position q of the heating plate 23 (Step T7).

Incidentally, depending on the holding position of the wafer W by the fork 3, the wafer W is sometimes out of the detection range of any of the detection parts 4, for example, when the fork 3A advances to the second slightly advanced position. This is the case where the amount of received light having the first value n1 is not detected, but only the amount of received light having the second value n2 is detected in the above schematic view in FIG. 5. In such a case, the edge positions of the wafer W cannot be detected, so that the transfer of the wafer W by the transfer arm 30 is stopped and a warning indicating the fact that the transfer stop has occurred is displayed on the display part 53 provided in the control part 5 and an alarm sound is generated from the alarm generation part 54 provided in the control part 5. The above-described series of operations are controlled by the temporary mode execution program 57.

Subsequently, a switching operation from the normal mode to the temporary mode will be described. This switching is automatically performed when abnormality of the light source part 41 or the abnormality of the light receiving part 42 in each detection part 4 is detected, and the wafer W held by the fork 3 at the occurrence of the abnormality and subsequent wafers W are transferred in the temporary mode.

The light source part 41 is composed of, for example, the LED as described above, and the abnormality that will occur in the LED is turnoff of the LED, decrease in light quantity of the LED, contamination of the lens provided in the LED, wire breakage of a cable between the control part 5 and the LED or the like. The detection of the above abnormality in the light source part 41 is performed, for example, every time the fork 3 holding the wafer W moves to the retracted position when the edge positions of the wafer W are detected, by detecting the light quantity of light emitted from the light source part 41 by means of the light receiving element arranged at a position where it is not usually shielded by the wafer W held by the fork 3.

Figure 24:
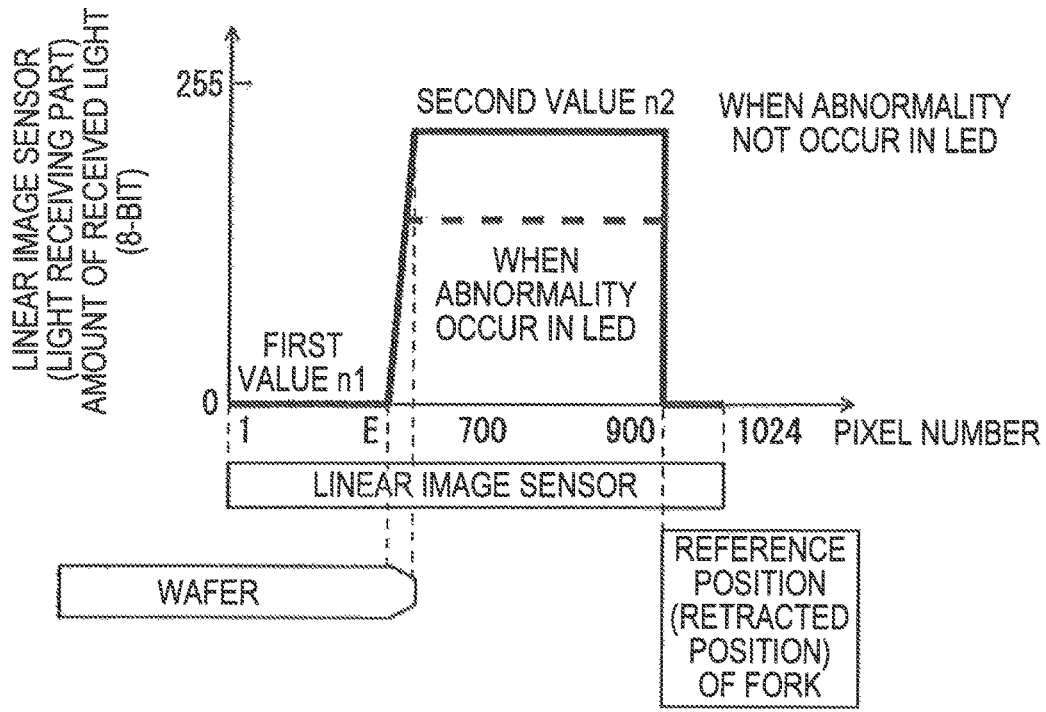
FIG. 24 is a schematic diagram illustrating an example of a detection result by the detection part of the transfer arm.

FIG. 24 is a graph schematically illustrating, similarly to already-described FIG. 5, the relationship between the pixel number and the amount of received light of the light receiving part 42 which will be explained referring to FIG. 24. In the case where the above abnormality occurs in the light source part 41, when the control part 5 transmits a signal to the light source part 41 to emit light, the amount of detected light changes from the second value n2 as exemplified in FIG. 24. When the amount of received light becomes lower than the allowable value, the detection part 4 including the light source part 41 is made unusable, and generation of an alarm sound and display of a warning on the screen are performed, and the operation mode is switched from the normal mode to the temporary mode. In other words, in this example, the center position of the wafer is calculated and the abnormality of the light source part 41 is determined, whereby a poor condition of the light source part 41 can be instantaneously grasped.

Figure 25:
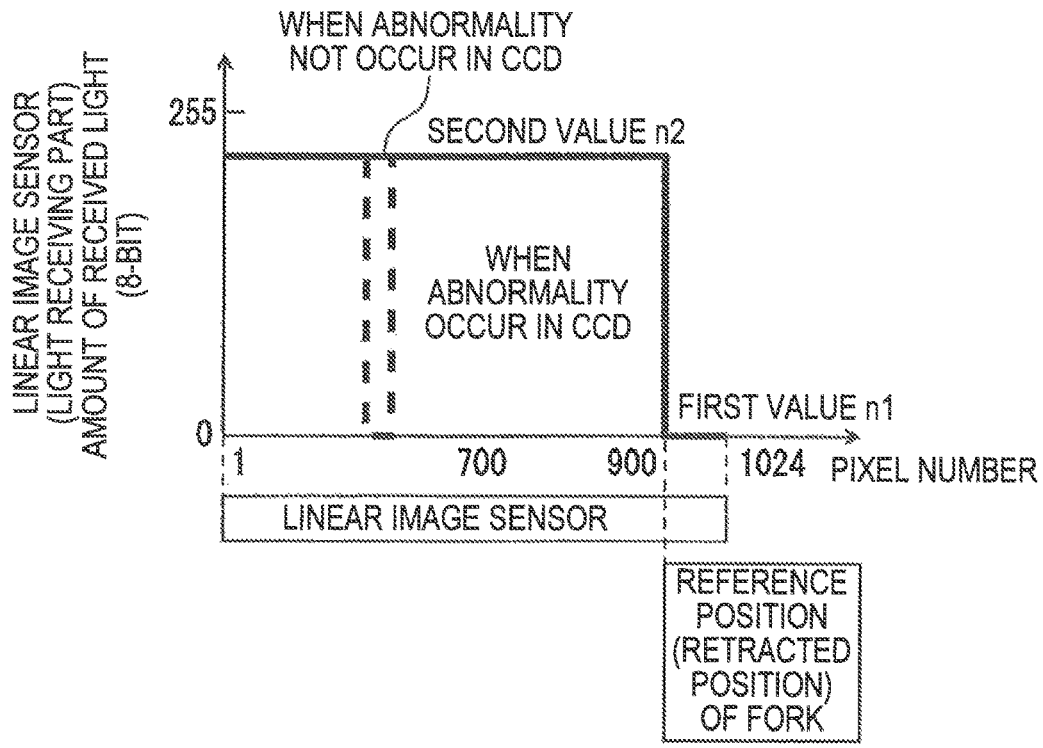
FIG. 25 is a schematic diagram illustrating an example of a detection result by the detection part of the transfer arm.

Next, the sensing method of abnormality in the light receiving part 42 will be explained. Examples of abnormality that will occur in the light receiving part 42 include a defect of each CCD, wire breakage of any cable between the control part 5 and the light receiving part 42 and the like. The method will be explained referring also to FIG. 25 schematically illustrating, similarly to FIG. 24, the relationship between the pixel number and the amount of received light.

The fork 3 delivers the wafer W to the module and then moves to the retracted position while holding no wafer W. Also at the time when the fork 3 moves to the retracted position in this manner, the light source part 41 applies light to the light receiving part 42 as in the case of detecting edge positions of the wafer W. Then, the amount of received light is detected, and the detection of the above abnormality is performed on the basis of the detection value. If the light receiving part 42 has the above abnormality when receiving the light as described above, the amount of received light by the pixel arranged at a position where it is not shielded by the fork 3 does not have the second value n2 which is supposed to be detected but sometimes varies. For example, when the CCD having abnormality constituting the light receiving part 42 cannot receive light at all, the pixel composed of the CCD detects a value different from the second value n2, such as the first value n1 or the like as indicated by a dotted line in FIG. 25.

Accordingly, in the case where there is a pixel indicating a detection value that is not the second value n2 or data on the detection value cannot be obtained, the control part 5 determines that abnormality occurs in the light receiving part 42 indicating such a detection value, and makes the detection part 4 including the light receiving part 42 unusable. Then, the control part 5 generates an alarm sound and displays a warning on the screen and switches the transfer mode as in the case where abnormality occurs in the light source part 41. The detection of the presence or absence of abnormality in the light receiving part 42 is performed, for example, every time one of the forks 3A, 3B delivers the wafer W to the module and then moves to the retracted position while holding no wafer W. In this event, the other fork 3 moves to the delivery position to deliver the wafer W so that the light from the light source part 41 is not blocked by the wafer W.

According to the above transfer arm 30, the center coordinates of the wafer W are calculated using three detection parts 4 such that the notch N of the wafer W does not overlap with the detection ranges of the detection parts 4, and there is a mode of transferring the wafer W to the module on the basis of the center coordinates. Accordingly, even if one of the four detection parts 4 becomes unusable, the operation of the transfer arm 30 does not need to be stopped and the user does not need to enter the apparatus, so that the transfer arm 30 can deliver the wafer W to the appropriate position of the module with high accuracy and a decrease in operating rate of the substrate treatment apparatus composed of the transfer arm 30 and the already-described modules can be suppressed. When the four detection parts 4 are usable, the center coordinates of the wafer W are detected using the four detection parts 4. Accordingly, the number of times of performing the operation of advancing to detect the center coordinates of the wafer W can be suppressed and a decrease in throughput can be suppressed.

As the light source part 41, a light source in which a plurality of LEDs are linearly arranged or a linear light source in which a light guide material is linearly provided on the light emission side of a single LED can be used. Further, as the light receiving part 42, a linear image sensor such as a fiber line sensor, a photoelectronic sensor or the like other than a CCD (Charge Coupled Device) line sensor can be used. In short, various light receiving elements such as a CCD, a photoelectronic sensor or the like can be used as the light receiving element of the light receiving part 42. Further, the light source part 41 may be provided on the upper side of the fork 3 and the light receiving part 42 may be provided on the lower side of the fork 3. Furthermore, four detection parts 4 can be provided on each of the two forks 3A, 3B. In this case, a pair of the light source part 41 and the linear image sensor constituting the detection part 4 only need to be provided above and below any of the wafers W held by the retracted forks 3A, 3B intervening therebetween. Four or more detection parts 4 may be provided.

Subsequently, a coating and developing apparatus to which the transfer arm 30, the heating module 21 and the resist coating module COT are applied will be briefly explained referring to FIG. 26 to FIG. 28. The coating and developing apparatus is connected to an exposure apparatus to constitute a resist pattern forming apparatus, and FIG. 26, FIG. 27, FIG. 28 are a plan view, a schematic perspective view, and a side view of the resist pattern forming apparatus respectively.

Figure 26:
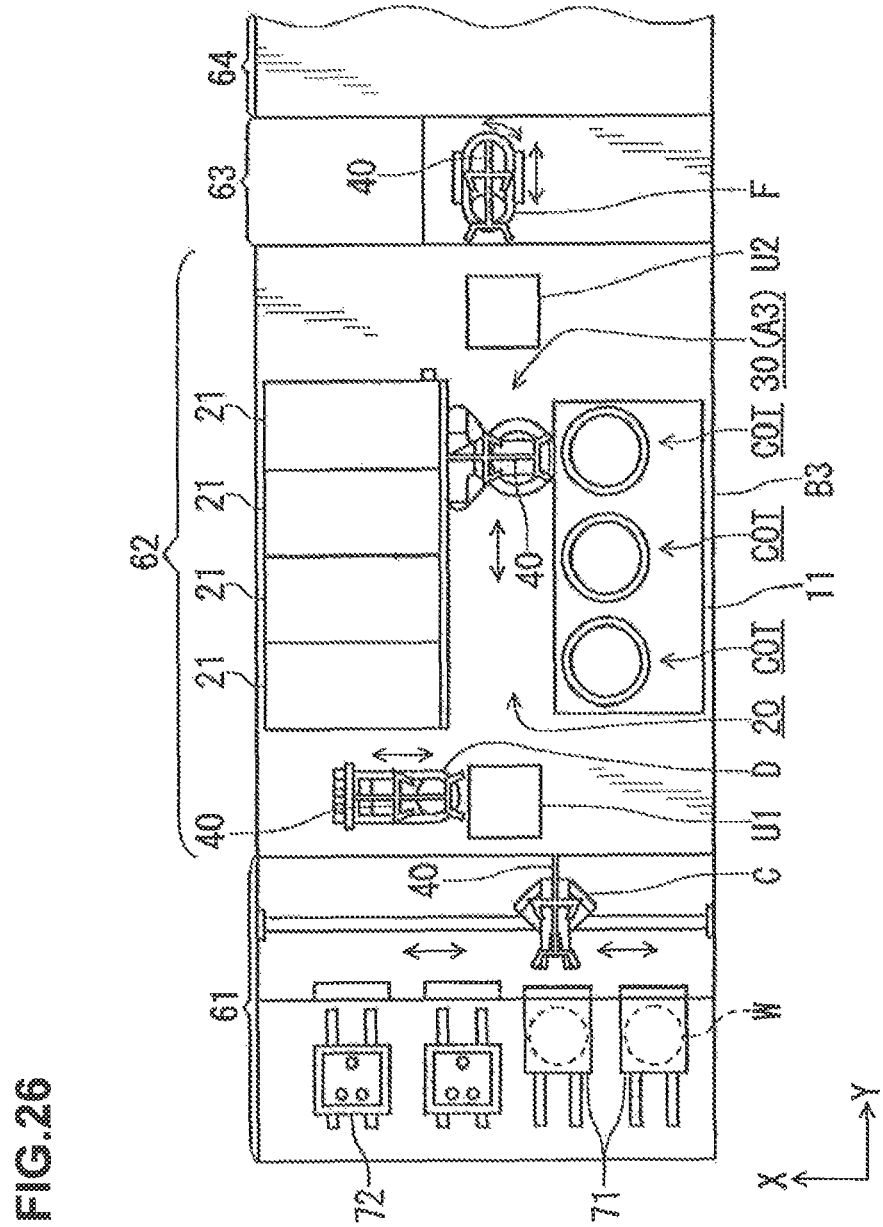
FIG. 26 is a plan view of a coating and developing apparatus including the transfer arm.
Figure 27:
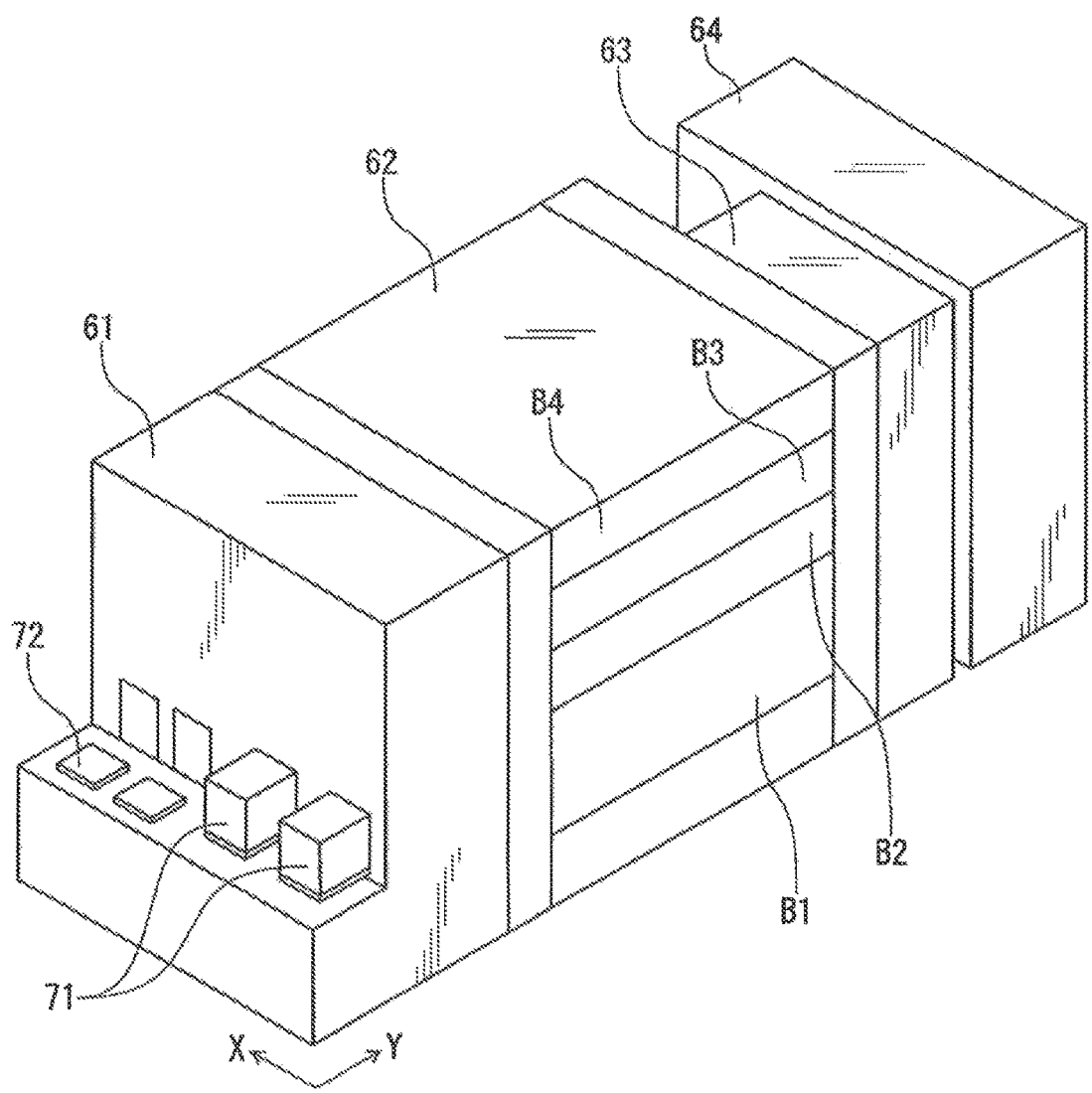
FIG. 27 is a perspective view of the coating and developing apparatus including the transfer arm.
Figure 28:
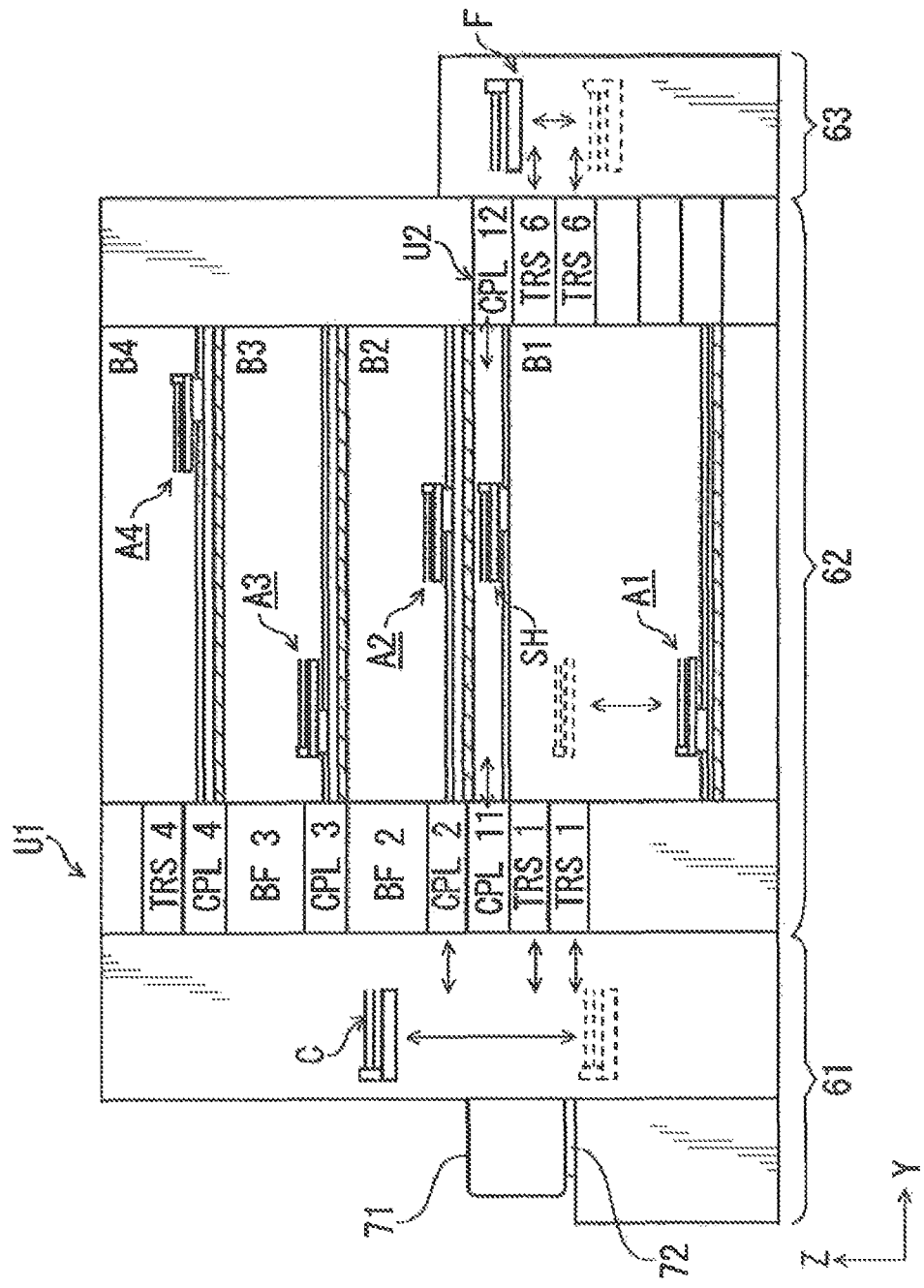
FIG. 28 is a side view of the coating and developing apparatus including the transfer arm.

The resist pattern forming apparatus has a carrier block 61, a treatment block 62, and an interface block 63 as illustrated in FIG. 26 and FIG. 27. Further, on the interface block 63 side in the resist pattern forming apparatus, an exposure apparatus 64 is provided. The treatment block 62 is provided to be adjacent to the carrier block 61. The interface block 63 is provided to be adjacent to the treatment block 62 on the side opposite to the carrier block 61 side of the treatment block 62. The exposure apparatus 64 is provided to be adjacent to the interface block 63 on the side opposite to the treatment block 62 side of the interface block 63.

The carrier block 61 has carriers 71, mounting tables 72 and a delivery means C. The carriers 71 are mounted on the mounting tables 72. The delivery means C is to take a wafer W out of the carrier 71 and deliver the wafer W to the treatment block 62, and to receive a treated wafer W treated in the treatment block 62 and return the treated wafer W into the carrier 71.

The treatment block 62 has, as illustrated in FIG. 26 and FIG. 27, a shelf unit U1, a shelf unit U2, a first block (DEV floor) B1, a second block (BCT floor) B2, a third block (COT floor) B3, and a fourth block (TCT floor) B4. The first block (DEV floor) B1 is to perform a developing treatment. The second block (BCT floor) B2 is to perform a forming treatment of an anti-reflection film to be formed on the lower layer side of a resist film. The third block (COT floor) B3 is to perform a coating treatment of a resist solution. The fourth block (TCT floor) B4 is to perform a forming treatment of an anti-reflection film to be formed on the upper layer side of the resist film. FIG. 26 and the already described FIG. 1 illustrate the third block COT floor B3.

The shelf unit U1 is composed of various modules stacked. The shelf unit U1 has, for example, delivery modules TRS1, TRS1, CFL11, CPL2, BF2, CPL3, BF3, CPL4, TRS4 stacked in order from the bottom as illustrated in FIG. 28. Further, a delivery arm D movable up and down is provided near the shelf unit U1 as illustrated in FIG. 26. Between the modules in the shelf unit U1, the wafer W is transferred by the delivery arm D.

The shelf unit U2 is composed of various modules stacked. The shelf unit U2 has, for example, delivery modules TRS6, TRS6, CPL12 stacked in order from the bottom as illustrated in FIG. 28. Note that, in FIG. 28, the delivery module labeled with CPL also serves as a cooling module for temperature regulation, and the delivery module labeled with BF also serves as a buffer module capable of mounting a plurality of wafers W therein.

Between the first block (DEV floor) B1 and the second block (BCT floor) B2, a shuttle SH is provided which directly transfers the wafer W from the shelf unit U1 to the shelf unit U2.

Each of the second block (BCT floor) B2, the third block (COT floor) B3, and the fourth block (TCT floor) B4 has a coating module of a chemical, a heating module group and the already-described transfer arm 30. The second block (BCT floor) B2 to the fourth block (TCT floor) B4 have the same configuration except that the chemical in the second block (BCT floor) B2 and the fourth block (TCT floor) B4 is a chemical for anti-reflection film and the chemical in the third block (COT floor) B3 is a resist solution. The first block (DEV floor) B1 has the same configuration as those of the other unit blocks except that a supply module of a developing solution is provided in place of the coating module of a chemical. For convenience of illustration, the transfer arms 30 in the unit blocks are indicated as A1, A2, A3, A4.

The interface block 63 has an interface arm F as illustrated in FIG. 28. The interface arm F is provided near the shelf unit U2 in the treatment block 62. Between the treatment modules in the shelf unit U2 and between the shelf unit U2 and the exposure apparatus 64, the wafer W is transferred by the interface arm F.

The wafers W from the carrier block 61 are transferred in sequence to one delivery module in the shelf unit U1, for example, the delivery module CPL2 corresponding to the second block (BCT floor) B2 by the delivery means C. The wafer W transferred to the delivery module CPL2 is delivered to the transfer arm A2 in the second block (BCT floor) B2, transferred to each of the treatment modules (the coating module and each of the treatment modules in the treatment module group of the heating and cooling system) via the transfer arm A2 and subjected to treatment in each of the treatment modules. Thus, an anti-reflection film is formed on the wafer W.

The wafer W on which the anti-reflection film has been formed is delivered to the transfer arm A3 in the third block (COT floor) B3 via the transfer arm A2, the delivery module BF2 in the shelf unit U1, the delivery arm D, and the delivery module CPL3 in the shelf unit U1. Then, the wafer W is transferred to each of the treatment modules (the coating module and each of the treatment modules in the treatment module group of the heating and cooling system) via the transfer arm A3 and subjected to treatment in each of the treatment modules. Thus, a resist film is formed on the wafer W.

The wafer W on which the resist film has been formed is delivered to the delivery module BF3 in the shelf unit U1 via the transfer arm A3. Note that the wafer W on which the resist film has been formed may further have an anti-reflection film formed in the fourth block (TCT floor) B4. In this case, the wafer W is delivered to the transfer arm A4 in the fourth block (TCT floor) B4 via the delivery module CPL4 and transferred to each of the treatment modules (the coating module and each of the treatment modules in the treatment module group of the heating and cooling system) via the transfer arm A4 and subjected to treatment in each of the treatment modules. Thus, an anti-reflection film is formed on the wafer W. The wafer W on which the anti-reflection film has been formed is then delivered to the delivery module TRS4 in the shelf unit U1 via the delivery arm A4.

The wafer W on which the resist film has been formed or the wafer W on which the anti-reflection film has been formed on the resist film is mounted on the delivery module CPL 11 via the delivery arm D, the delivery module BF3 or TRS4, delivered to the shuttle SH, directly transferred to the delivery module CPL12 in the shelf unit U2, and then delivered to the interface arm F in the interface block 63. The wafer W delivered to the interface arm F is transferred to the exposure apparatus 64 and subjected to predetermined exposure processing. The wafer W is then mounted on the delivery module TRS6 in the shelf unit U2 via the interface arm F, and returned into the treatment block 62. The wafer W returned to the treatment block 62 is subjected to a developing treatment in the first block (DEV floor) B1. The wafer W subjected to the developing treatment is returned to the carrier 71 via the transfer arm A1, the delivery module TRS1 in the shelf unit U1, and the delivery means C.

Though an example of the transfer by the transfer arm 30 from the resist coating module COT to the heating module 21 has been explained in the already-described example, each of the delivery means C, the delivery arm D, and the interface arm F other than the transfer arm 30 also corresponds to the substrate transfer apparatus in the present invention, and has the aforementioned substrate edge position detection mechanism 40 as with the transfer arm 30. In these substrate transfer apparatuses, the calculation of the center coordinates of the wafer W as explained for the transfer arm 30 is performed when transferring the wafer W from a module at the preceding stage to a module at the subsequent stage, and transfer is performed on the basis of the center coordinates, in short, in the transfer path, all the transfer from the module at the preceding stage to the module at the subsequent stage is performed as has been explained in the transfer example from the resist coating module COT to the heating module 21.

Figure 29:
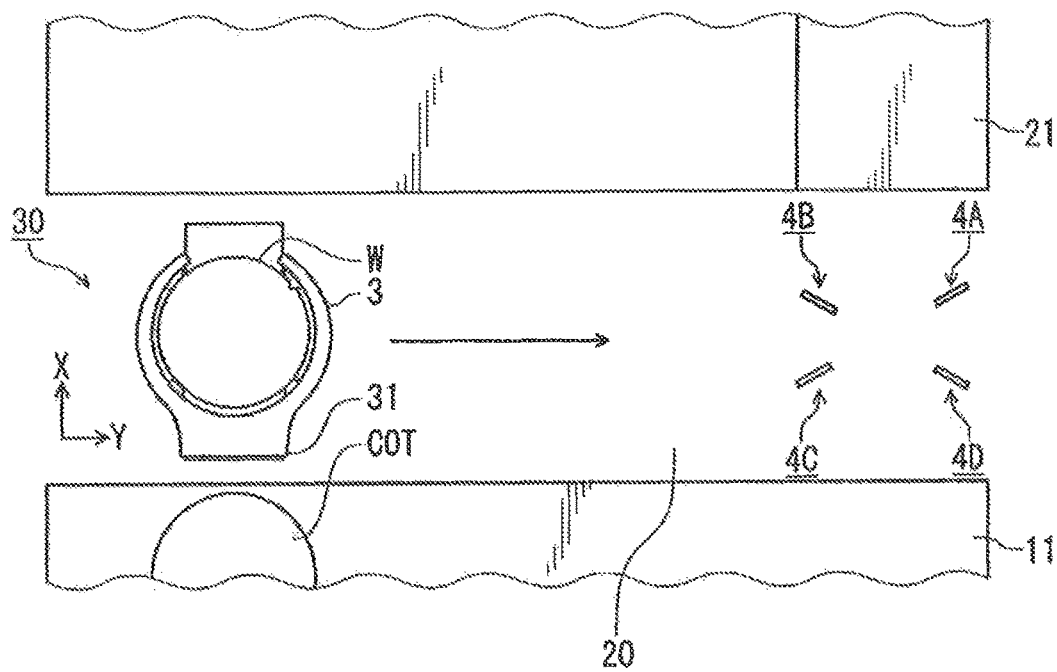
FIG. 29 is a schematic view illustrating another configuration and another transfer method of the transfer arm.
Figure 30:
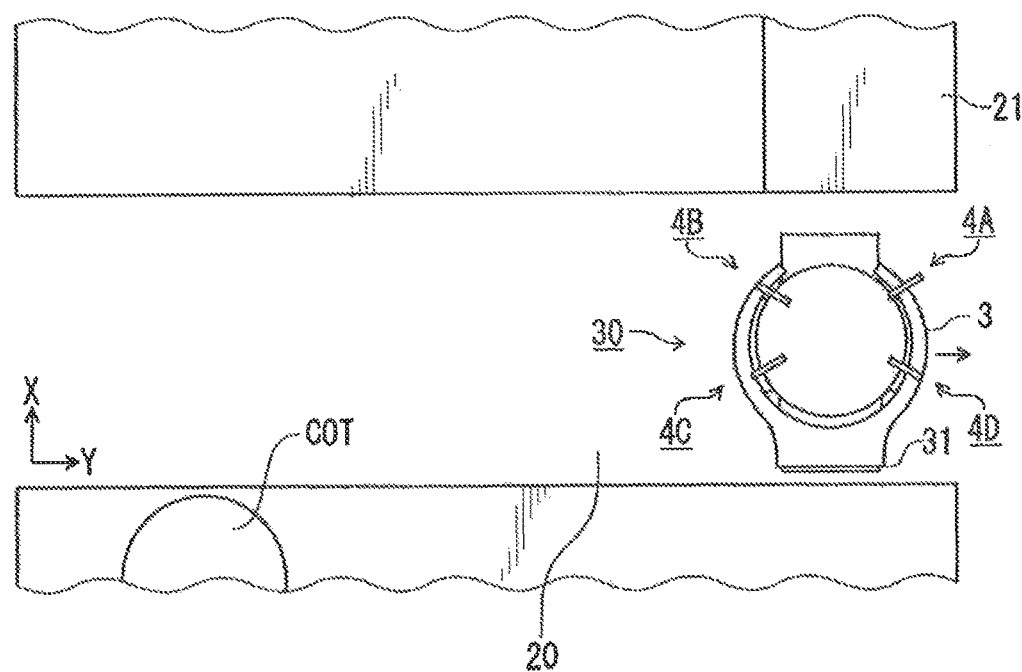
FIG. 30 is a schematic view illustrating another configuration and another transfer method of the transfer arm.
Figure 31:
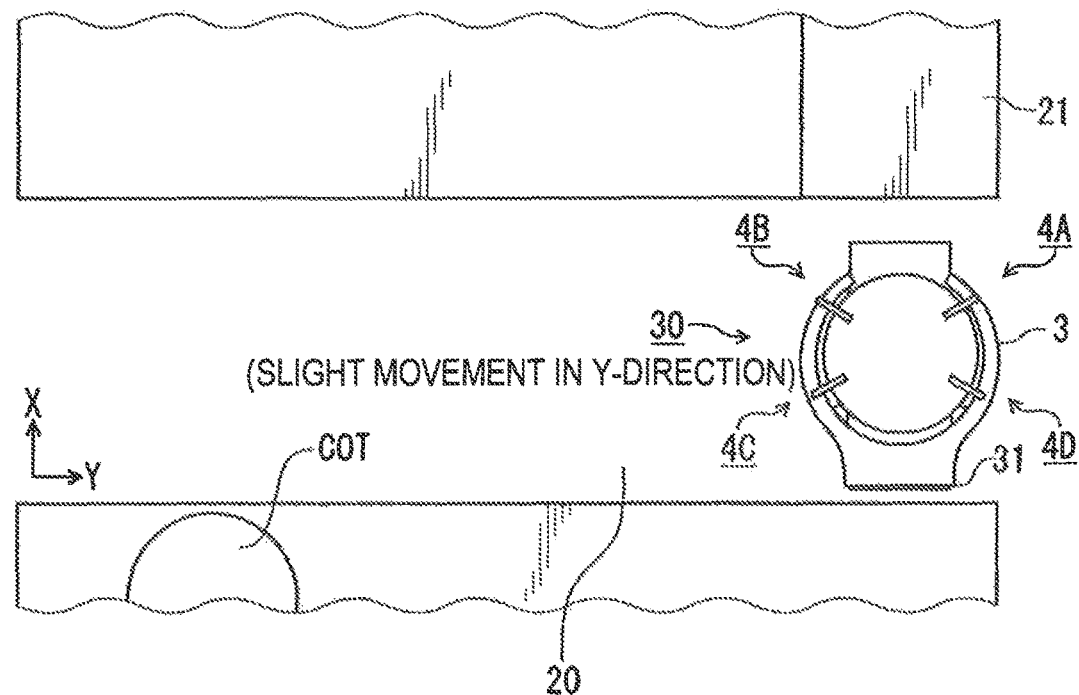
FIG. 31 is a schematic view illustrating another configuration and another transfer method of the transfer arm.

Incidentally, the detection parts 4 are not limited to be provided on the base 31 as explained above. As illustrated in FIG. 29, FIG. 30, the light source parts 41 and the light receiving parts 42 are arranged on the ceiling side and the floor side of the transfer path 20 so that the detection of the center position of the wafer W and the decision of the delivery position of the fork 3 may be performed when the base 31 and the fork 3 pass between them. The base 31 is formed in a shape not blocking the light from the light source parts 41. In addition, the base 31 is slightly moved in the Y-direction as illustrated in FIG. 31 instead of slightly displacing the fork 3 in the X-direction with respect to the detection parts 4, to displace the position of the wafer W with respect to the notch N for the detection of the center position.

Further, the above-described detection of the center position of the wafer W only needs to be performed during the transfer from the module at the preceding stage from which the wafer W is received to the module at the subsequent stage to which the wafer is delivered. Accordingly, the detection may be performed with the base 31 stopped after the fork 3 retracts or may be performed with the fork 3 advancing during movement of the base 31 to the module at the subsequent stage. Though the detection operation of the notch N is performed by advancing the fork 3 from the reference position that is the retracted position thereof, the detection operation of the notch N may be performed by retracting the fork 3 from a reference position that is the front side of the retracted position. It is also possible to provide a drive mechanism so that the detection parts 4 can move with respect to the base 31, and move the detection parts 4 instead of the fork 3 and detect the center position of the wafer W. Note that in the case where the center position o' is detected in the temporary mode, the fork 3 may be moved for acquisition to a position different from the position where the center position o' is acquired in the normal mode. In other words, the fork may be moved for detection to a position displaced respectively from the retracted position and the first slightly advanced position.

Further, five or more detection parts 4 may be provided so that the normal mode is performed using the detection parts 4, whereas the above-described temporary mode may be executed when the number of usable detection parts 4 becomes three.

Though whether or not the detection range of the detection part 4 overlaps with the notch N is determined on the basis of the presence or absence of positional change in the Y-direction of the center coordinates at Steps S6, T4 in the above example, another determination method will be explained. Each coordinates o' acquired at the first slightly advanced position are displaced to the rear side of the fork 3 by the amount of movement of the fork 3 from the retracted position. The distance between each coordinates o' acquired as explained above and each coordinates o' acquired at the retracted position is calculated. More specifically, the movement amount (displacement amount) of each coordinates o' after subtracting therefrom the movement amount of the fork 3 at each coordinates o' between the retracted position and the first slightly advanced position as illustrated at the lower section of FIG. 16 is calculated. This movement amount is $\{(X''-X')^2+(Y''-Y')^2\}^{1/2}$ where the X-coordinate and the Y-coordinate of o' displaced from the first slightly advanced position as described above are X" and Y", the X-coordinate and the Y-coordinate at the retracted position are X' and Y'. o' that is calculated using the sensor whose detection range does not overlap with the notch N as illustrated in FIG. 16 is smaller in movement amount than the other o'.

Hence, at Steps S5, S6 in the normal mode, o' with the radius falling within the normal range and the minimum movement amount can be regarded the correct center position. At Step T4 in the temporary mode, it can be determined that the detection range does not overlap with the notch N when the movement amount falls within a preset allowable range and each calculated radius falls within the normal range. When the movement amount does not fall within the allowable range, the fork 3A is moved to the second slightly advanced position to acquire the center coordinates as in the case where the difference in the Y component does not fall within the allowable range.

What is claimed is:

1. A substrate transfer apparatus including a substrate holding part movable in a lateral direction to transfer a circular substrate from a first module to a second module, comprising:
   a sensor part comprising at least four sensor pairs comprising light source parts applying light to positions different from one another at an edge portion and light receiving parts paired with the light source parts, to detect positions of at least four points of the edge portion of the substrate held by the substrate holding part;
   a drive part for moving the substrate holding part relative to the sensor part; and
   a control part outputting control signals to control operations of the substrate holding part, the drive part, and the sensor part,
      wherein the control part outputs the control signals to execute:
   a determination step of determining for each of the sensor pairs whether the sensor pair is usable or unusable on the basis of a detection result of the light receiving part of the sensor pair, wherein the sensor pair is unusable due to a fault in the sensor pair;
   a detection step of detecting positions of the edge portion of the substrate with the substrate holding part holding the substrate received from the first module located at a set position preset with respect to each of the sensor pairs; and
   a decision step of:
      (i) deciding, when four or more sensor pairs are determined to be usable at the determination step, a delivery position of the substrate holding part with respect to the second module on the basis of the positions of the edge portion detected at the detection step by at least four usable sensor pairs, and
      (ii) deciding, when three sensor pairs are determined to be usable at the determination step, a delivery position of the substrate holding part with respect to the second module on the basis of the positions of the edge portion detected at the detection step by the three usable sensor pairs.

2. The substrate transfer apparatus as set forth in claim 1, wherein the substrate is provided with a cutout at the edge portion,
   wherein when three sensor pairs are determined to be usable at the determination step, the control part
   executes, as the detection step,
      a first step of detecting positions of the edge portion of the substrate with the substrate holding part holding the substrate received from the first module located at a first position preset with respect to the sensor part, and
      a second step of detecting positions of the edge portion of the substrate with the substrate holding part located at a second position displaced from the first position with respect to the sensor part; and
   decides, as the decision step,
      a delivery position of the substrate holding part with respect to the second module on the basis of the positions of the edge portion obtained at the first step and the second step from the sensor pairs determined to be usable.

3. The substrate transfer apparatus as set forth in claim 2, wherein the decision step executes:
   a third step of deriving, assuming that a state that a light irradiation region of the light source part is located at the cutout of the substrate is called an abnormal state, and based on detection results at the first step and the second step, any of results:
      a. that the abnormal state occurs at any of the first position and the second position and that at which of the first position and the second position the abnormal state occurs is able to be specified;
      b. that the abnormal state does not occur at any of the first position and the second position;
      c. that the abnormal state occurs at both of the first position and the second position; and
      d. that the abnormal state occurs at least at any of the first position and the second position but that position is not able to be specified; and
   a fourth step of deciding, when a result at the third step is a or b, a delivery position of the substrate holding part with respect to the second module on the basis of the positions of the edge portion detected at a position where the abnormal state does not occur of the first position and the second position, and detecting, when the result is c or d, positions of the edge portion of the substrate with the substrate holding part moved to a third position different from the first position and the second position with respect to the sensor part to apply light to a position off the cutout of the substrate and deciding the delivery position on the basis of the positions.

4. The substrate transfer apparatus as set forth in claim 3, wherein the determination whether the sensor pair is usable or unusable at the determination step is performed based on a quantity of light or a size of a region of light received by the light receiving part.

5. The substrate transfer apparatus as set forth in claim 2, wherein the determination whether the sensor pair is usable or unusable at the determination step is performed based on a quantity of light or a size of a region of light received by the light receiving part.

6. The substrate transfer apparatus as set forth in claim 1, wherein the determination whether the sensor pair is usable or unusable at the determination step is performed based on a quantity of light or a size of a region of light received by the light receiving part.

7. A substrate transfer method comprising:
detecting, in a sensor part of a substrate holding part movable in a lateral direction to transfer a circular substrate from a first module to a second module, positions of at least four points of an edge portion of the substrate held by the substrate holding part, the sensor part comprising at least four sensor pairs comprising light source parts applying light to positions different from one another at the edge portion and light receiving parts paired with the light source parts;
determining for each of the at least four sensor pairs whether the sensor pair is usable or unusable on the basis of a detection result of the light receiving part of the sensor pair;
detecting positions of the edge portion of the substrate with the substrate holding part holding the substrate received from the first module located at a set position preset with respect to each of the sensor pairs;
(i) deciding, when four or more sensor pairs are determined to be usable at the determination step, a delivery position of the substrate holding part with respect to the second module on the basis of the positions of the edge portion detected by at least four usable sensor pairs, and
(ii) deciding, when three sensor pairs are determined to be usable at the determination step, a delivery position of the substrate holding part with respect to the second module on the basis of the positions of the edge portion detected by the three usable sensor pairs; and
driving a drive part to move the substrate holding part relative to the sensor part to the delivery position.

8. The substrate transfer method as set forth in claim 7, wherein the substrate is provided with a cutout at the edge portion,
wherein when three sensor pairs are determined to be usable at the determination step,
the detecting comprises:
first detecting positions of the edge portion of the substrate with the substrate holding part holding the substrate received from the first module located at a first position preset with respect to the sensor part; and
second detecting positions of the edge portion of the substrate with the substrate holding part located at a second position displaced from the first position with respect to the sensor part, and
the deciding comprises:
deciding a delivery position of the substrate holding part with respect to the second module on the basis of the positions of the edge portion obtained at the first position and the second position from the sensor pairs determined to be usable.

9. The substrate transfer method as set forth in claim 8, wherein the deciding comprises:
deriving, assuming that a state that a light irradiation region of the light source part is located at the cutout of the substrate is called an abnormal state, and based on detection results at the first detecting and the second detecting, any of results:
a. that the abnormal state occurs at any of the first position and the second position and that at which of the first position and the second position the abnormal state occurs is able to be specified;
b. that the abnormal state does not occur at any of the first position and the second position;
c. that the abnormal state occurs at both of the first position and the second position; and
d. that the abnormal state occurs at least at any of the first position and the second position but that position is not able to be specified; and
deciding, when a result at the third step is a or b, a delivery position of the substrate holding part with respect to the second module on the basis of the positions of the edge portion detected at a position where the abnormal state does not occur of the first position and the second position, and detecting, when the result is c or d, positions of the edge portion of the substrate with the substrate holding part moved to a third position different from the first position and the second position with respect to the sensor part to apply light to a position off the cutout of the substrate and deciding the delivery position on the basis of the positions.

10. The substrate transfer method as set forth in claim 9, wherein the determination whether the sensor pair is usable or unusable is performed based on a quantity of light or a size of a region of light received by the light receiving part.

11. The substrate transfer method as set forth in claim 8, wherein the determination whether the sensor pair is usable or unusable is performed based on a quantity of light or a size of a region of light received by the light receiving part.

12. The substrate transfer method as set forth in claim 7, wherein the determination whether the sensor pair is usable or unusable is performed based on a quantity of light or a size of a region of light received by the light receiving part.

13. A non-transitory storage medium storing a computer program executable by a controller to cause a controller to:
detect, in a sensor part of a substrate holding part movable in a lateral direction to transfer a circular substrate from a first module to a second module, positions of at least four points of an edge portion of the substrate held by the substrate holding part, the sensor part comprising at least four sensor pairs comprising light source parts applying light to positions different from one another at the edge portion and light receiving parts paired with the light source parts;

determine for each of the at least four sensor pairs whether the sensor pair is usable or unusable on the basis of a detection result of the light receiving part of the sensor pair;

detect positions of the edge portion of the substrate with the substrate holding part holding the substrate received from the first module located at a set position preset with respect to each of the sensor pairs;

(i) decide, when four or more sensor pairs are determined to be usable at the determination step, a delivery position of the substrate holding part with respect to the second module on the basis of the positions of the edge portion detected by at least four usable sensor pairs, and (ii) decide, when three sensor pairs are determined to be usable at the determination step, a delivery position of the substrate holding part with respect to the second module on the basis of the positions of the edge portion detected by the three usable sensor pairs; and drive a drive part to move the substrate holding part relative to the sensor part to the delivery position.

* * * * *